(12) United States Patent
Endo et al.

(10) Patent No.: US 10,281,495 B2
(45) Date of Patent: May 7, 2019

(54) ANALYSIS DEVICE, ANALYSIS METHOD, AND PROGRAM

(75) Inventors: Satoshi Endo, Tokyo (JP); Yoshiaki Koizumi, Tokyo (JP); Takuya Mukai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 697 days.

(21) Appl. No.: 14/401,724

(22) PCT Filed: Jun. 14, 2012

(86) PCT No.: PCT/JP2012/065286
§ 371 (c)(1),
(2), (4) Date: Nov. 17, 2014

(87) PCT Pub. No.: WO2013/186908
PCT Pub. Date: Dec. 19, 2013

(65) Prior Publication Data
US 2015/0142357 A1 May 21, 2015

(51) Int. Cl.
*G01R 13/02* (2006.01)
*G01R 19/165* (2006.01)
(Continued)

(52) U.S. Cl.
CPC ....... *G01R 13/0236* (2013.01); *G01R 19/165* (2013.01); *H04L 43/0847* (2013.01); *H04L 69/40* (2013.01)

(58) Field of Classification Search
CPC ............ G01R 19/0236; G01R 13/0236; G01R 19/165; H04L 43/0847; H04L 69/40
(Continued)

(56) References Cited

U.S. PATENT DOCUMENTS 4,829,298 A * 5/1989 Fernandes ............... G01K 1/024
340/870.16
5,185,735 A 2/1993 Ernst
(Continued)

FOREIGN PATENT DOCUMENTS

JP H05-300154 A 11/1993
JP 2006-054755 A 2/2003
(Continued)

OTHER PUBLICATIONS

International Search Report of the International Searching Authority dated Aug. 7, 2012 for the corresponding international application No. PCT/JP2012/065286 (and English translation).

*Primary Examiner* — Michael P Nghiem
*Assistant Examiner* — Dacthang P Ngo
(74) *Attorney, Agent, or Firm* — Posz Law Group, PLC

(57) ABSTRACT

A switcher transmits, to an extractor/signal determiner, a converted current signal generated by a current-voltage converter when a converted current signal determiner determines that the converted current signal is generated by transmission of a current signal over a communication line, in the meantime, performs a switch-over so as not to transmit, to the extractor/signal determiner, a converted voltage signal generated by a voltage sensor. In addition, the switcher transmits, to the extractor/signal determiner, the converted voltage signal when a converted voltage signal determiner determines that the converted voltage signal is generated by transmission of a voltage signal over a communication line, in the meantime, performs a switch-over so as not to transmit, to the extractor/signal determiner, the converted current signal generated by the current-voltage converter.

19 Claims, 17 Drawing Sheets

(51) Int. Cl.
*H04L 12/26* (2006.01)
*H04L 29/14* (2006.01)

(58) Field of Classification Search
USPC ...... 702/57, 58, 67, 104, 122, 182; 323/234; 340/870.16
See application file for complete search history.

(56) References Cited

U.S. PATENT DOCUMENTS

| | | | |
|---|---|---|---|
| 2007/0074085 A1 | 3/2007 | Ferguson et al. | |
| 2012/0063055 A1* | 3/2012 | Morong | H01F 38/32 361/268 |
| 2012/0194146 A1* | 8/2012 | Longacre | G06F 1/266 323/234 |
| 2012/0307918 A1* | 12/2012 | Matsumoto | H04B 3/548 375/257 |

FOREIGN PATENT DOCUMENTS

| | | | | |
|---|---|---|---|---|
| JP | 2007-251384 A | 9/2007 | | |
| JP | 2009-510909 A | 3/2009 | | |
| JP | 2011-239147 A | 11/2011 | | |
| WO | WO2011090206 | * | 7/2011 | ............. H04L 25/02 |

\* cited by examiner

ANALYSIS DEVICE, ANALYSIS METHOD, AND PROGRAM

CROSS REFERENCE TO RELATED APPLICATION

This application is a U.S. national stage application of International Patent Application No. PCT/JP2012/065286 filed on Jun. 14, 2012.

TECHNICAL FIELD

The present disclosure relates to an analysis device, an analysis method and a program.

BACKGROUND

Analysis on signals, such as communication data, transmitted via a communication line has been made possible by, for example, a communication-status analysis system disclosed in Patent Literature 1, an air-conditioning communication data collection device disclosed in Patent Literature 2, and a network monitoring device disclosed in Patent Literature 3.

The communication-status analysis system disclosed in Patent Literature 1 receives communication data (signal) from communication network connected with a plurality of controllers including communication circuits, and stores communication data. The communication-status analysis system selects communication data of a specific controller (for example, a controller assumed as defective) from the stored communication data. Next, the communication-status analysis system re-transmits communication data transmitted from the controller other than the selected and specific controller to the selected and specific controller. This re-transmission enables a user to analyze a communication status (reception analysis for communication data) for the specific controller.

The air-conditioning communication data collection device disclosed in Patent Literature 2 stores, when detecting an anomaly in communication packets transmitted via a communication line, signal waveform data at the time points before and after the anomaly is detected. The air-conditioning communication data collection device then analyzes the stored signal waveform data. This makes it possible for the user to analyze any anomaly occurred in the signal waveform data (signals).

The network monitoring device disclosed in Patent Literature 3 stores transmission data that is transmitted via network (communication line). Such stored transmission data enables the user to analyze the transmission status of transmission data and the transmission details of the transmission data. The stored transmission data is constituted by a value of current and that of voltage (value of current flowing through power cable and value of voltage applied across the power cable) that are collected from network.

PATENT LITERATURE

Patent Literature 1: Unexamined Japanese Patent Application Kokai Publication No. 2006-054755
Patent Literature 2: Unexamined Japanese Patent Application Kokai Publication No. 2011-239147
Patent Literature 3: Unexamined Japanese Patent Application Kokai Publication No. 2007-251384

Technical Problem

Following problems are brought in manufacturing a following device using the technologies disclosed in Patent Literatures 1 to 3, that is, more specifically, in manufacturing the device including a function that receives a current signal which sends information based on the magnitude of a value of current flowing through the communication line, generates display information based on the received current signal, and outputs the display information to, for example, a display, and a function that receives a voltage signal which sends information based on the magnitude of a value of voltage applied across the communication line, generates display information based on the received voltage signal, and outputs the display information to, for example, the display. More precisely, according to such a device, there are problems with necessary redundancy of the function that generates the display information and outputs the generated display information that needs to be provided to each of the current signal operation and voltage signal operation.

SUMMARY

The present disclosure has been made in view of such circumstances, and it is an objective of the present disclosure to provide an analysis device having no duplicate use of a function that generates display information and outputs the generated display information, an analysis method, and a program.

To achieve the objectives above, there is provided in accordance with the present disclosure, an analysis device that comprises a converted current signal generator that generates a converted current signal indicating a voltage value that corresponds to magnitude of a value of a current flowing through a communication line. A converted current signal determiner determines, when the converted current signal meets a preset condition, whether or not the converted current signal is generated. A converted voltage signal generator generates a converted voltage signal that corresponds to magnitude of a value of a voltage applied across a communication line. A converted voltage signal determiner determines, when the converted voltage signal meets a preset condition, whether or not the converted voltage signal is generated. A display information generator generates display information from either one of the converted current signal and the converted voltage signal. An outputter outputs the display information generated by the display information generator to a display device displayable of display information. A switcher performs, when the converted current signal is generated by transmission of the current signal over the communication line, a switch-over so as to transmit the converted current signal to the display information generator, and simultaneously so as not to transmit the converted voltage signal to the display information generator, and the switcher performs, when the converted voltage signal is generated by transmission of the voltage signal over the communication line, a switch-over so as to transmit the converted voltage signal to the display information generator, and simultaneously so as not to transmit the converted current signal to the display information generator.

According to the present disclosure, there is no duplicate use of a feature that generates display information and outputs the generated display information.

DETAILED DESCRIPTION

First Embodiment

Figure 1:
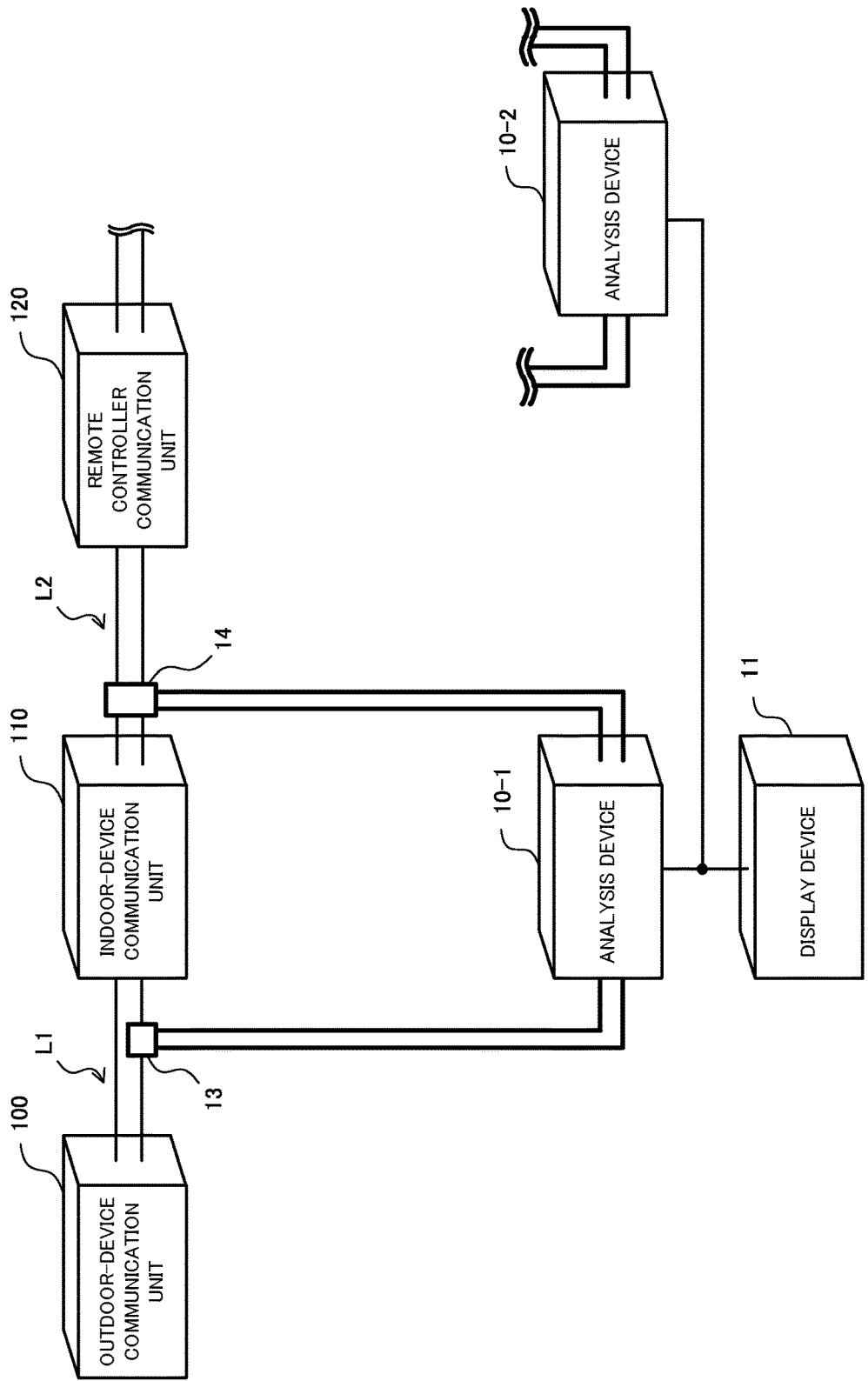
FIG. 1 is a diagram illustrating a connection of an analysis device according to a first embodiment of the present disclosure.

Hereinafter, an analysis device 10 according to the first embodiment of the present disclosure will be described with reference to FIGS. 1 to 15. As illustrated in FIG. 1, the analysis device 10 includes a current sensor 13 and a voltage sensor 14.

The current sensor 13 includes, for example, a converter. The current sensor 13 is disposed in such a manner that either of two communication lines L1 for transmitting signals exchanged between an outdoor-device communication unit 100 and an indoor-device communication unit 110 through a current transmission technique is enclosed by, for example, a primary side of the converter. In this case, the current transmission technique is a technique for determining a high level of a signal or a low level thereof in accordance with the magnitude of a current value (in accordance with how large or small the current value is). The current sensor 13 outputs a current having a current value corresponding to the magnitude of the current that flows through one of the communication lines L1 to the analysis device 10. Note that the outdoor-device communication unit 100 is a communication device installed on, for example, an air conditioner outdoor device, and the indoor-device communication unit 110 is a communication device installed on, for example, an air conditioner indoor device.

The voltage sensor 14 includes, for example, a coil. The voltage sensor 14 has, for example, respective terminals of the coil connected to respective two communication lines L2 for carrying a signal that is exchanged between the indoor-device communication unit 110 and a remote controller communication unit 120 through a voltage transmission technique. Here, the voltage transmission technique is a technique for determining a high level of a signal or a low level thereof in accordance with the magnitude of a value of voltage (in accordance with how large or small the voltage value is). The voltage sensor 14 outputs a converted voltage signal indicating a voltage value corresponding to the magnitude of a voltage applied across the communication lines L2 to the analysis device 10. That is, the voltage sensor 14 generates a converted voltage signal indicating a voltage value that corresponds to the magnitude of the value of voltage applied across the communication lines L2. Note that the remote controller communication unit 120 is a communication device provided on, for example, a remote controller for transmitting voltage signals to an air conditioner indoor device.

As discussed above, since the analysis device 10 includes the current sensor 13 and the voltage sensor 14, the analysis device 10 is capable of both receiving signals exchanged through the current transmission technique and receiving signals exchanged through the voltage transmission technique. Hereinafter, signals exchanged through the current transmission technique, in other words, signals that sends information based on the magnitude of a current value, will be referred to as a current signal. In addition, signals exchanged through the voltage transmission technique, in other words, signals that sends information based on the magnitude of a voltage value, will be referred to as a voltage signal.

When it is desirable to receive signals (current signal and voltage signal) transmitted through a communication line other than the communication lines L1 and the communication lines L2, a plurality of analysis devices 10 may be utilized such that in addition to an analysis device 10-1, for example, an analysis device 10-2 is provided. At this time, the analysis device 10-2 may employ the same configuration as that of the analysis device 10-1.

The analysis device 10 (the analysis device 10-1 and the analysis device 10-2) is connected to a display device 11. The display device 11 receives display information that is output by the analysis device 10 (the analysis device 10-1 and the analysis device 10-2), and displays a screen that is generated based on the display information.

Figure 2:
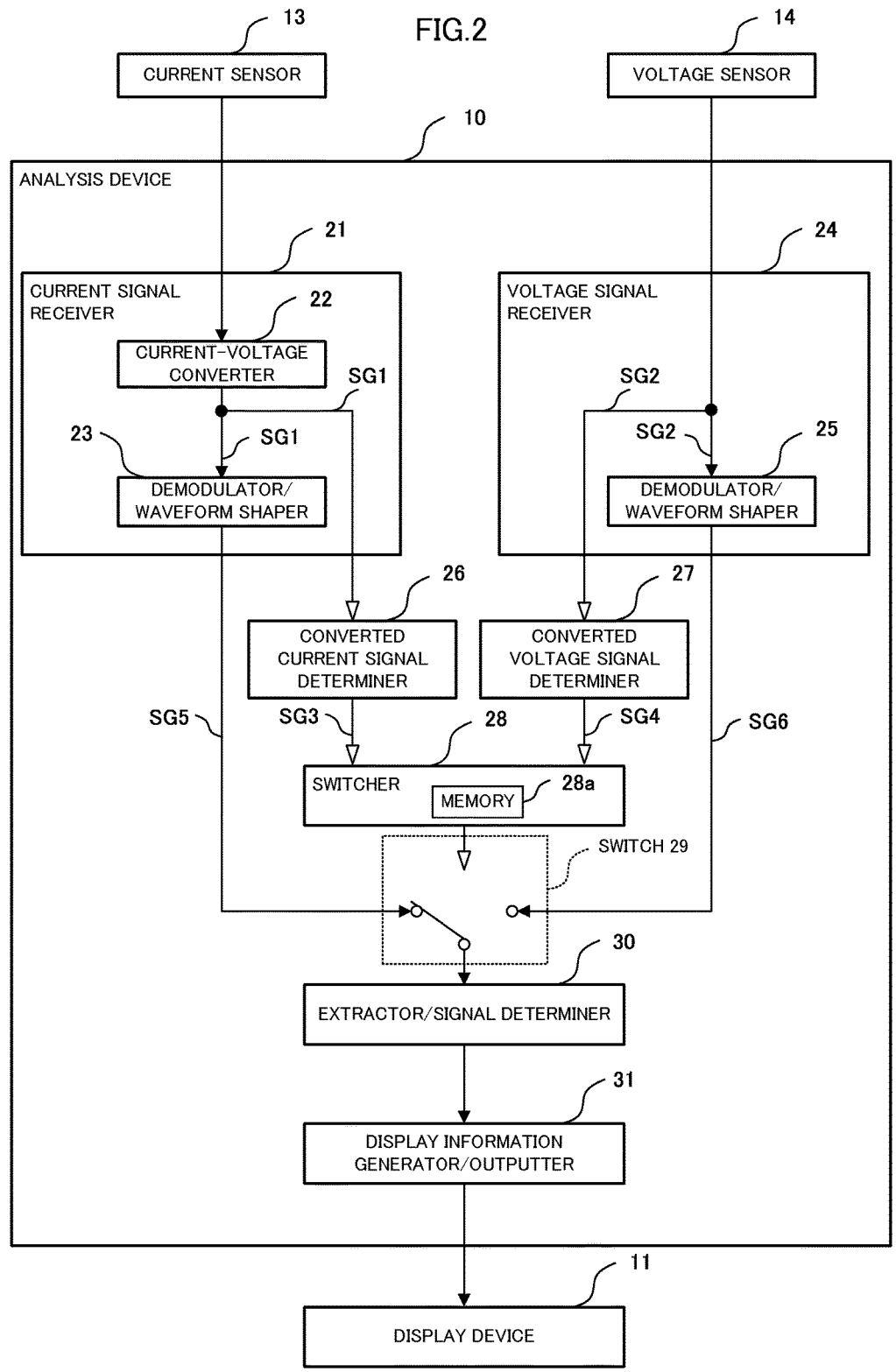
FIG. 2 is a block diagram illustrating the analysis device according to the first embodiment.

As illustrated in FIG. 2, the analysis device 10 includes the current sensor 13, the voltage sensor 14, a current signal receiver 21, a voltage signal receiver 24, a converted current signal determiner 26, a converted voltage signal determiner 27, a switcher 28, a switch 29, an extractor/signal determiner 30, and a display information generator/outputter 31.

The current signal receiver 21 includes a current-voltage converter 22, and a demodulator/waveform shaper 23. The current-voltage converter 22 is connected to the current sensor 13. The current-voltage converter 22 converts a current that is output by the current sensor 13 to a voltage, and outputs this voltage having undergone the conversion (a converted current signal SG1). That is, the current-voltage converter 22 generates the converted current signal SG1 indicating a voltage value that corresponds to the magnitude of the current value (value of current flowing through the communication lines L1) that is output by the current sensor 13.

When a current of, for example, 20 mA is output by the current sensor 13, the current-voltage converter 22 converts such current to a voltage of 5 volts. When a current of, for example, 4 mA is output by the current sensor 13, the current-voltage converter 22 converts such current to a voltage of 1 volt.

The demodulator/waveform shaper 23 is connected to the current-voltage converter 22. The demodulator/waveform shaper 23 demodulates the converted current signal SG1 that is output by the current-voltage converter 22 and performs a waveform shaping thereon, and, outputs a signal (command signal SG5) having undergone demodulation and waveform shaping. The demodulator/waveform shaper 23 performs an ASK (Amplitude Shift Keying) demodulation when, for example, the converted current signal SG1 that is output by the current-voltage converter 22 is subjected to an ASK-modulation in accordance with an ASK modulation performed on a current signal. Note that when, for example, the current signal is not subjected to a modulation, the demodulator/waveform shaper 23 outputs a command signal SG5 that is obtained by performing only the waveform shaping on the converted current signal SG1 without demodulating the converted current signal SG1 that is output by the current-voltage converter 22.

The voltage signal receiver 24 includes a demodulator/waveform shaper 25. The demodulator/waveform shaper 25 is connected to the voltage sensor 14. The demodulator/waveform shaper 25 demodulates a converted voltage signal SG2 that is output by the voltage sensor 14 and performs a waveform shaping thereon, and, outputs a signal (command signal SG6) having undergone demodulation and waveform shaping. The demodulator/waveform shaper 25 performs an AM (amplitude modulation) demodulation when, for example, the converted voltage signal SG2 that is output by the voltage sensor 14 is subjected to an AM-modulation in accordance with an AM performed on a voltage signal. Note that when, for example, the voltage signal is not subjected to a modulation, the demodulator/waveform shaper 25 outputs the command signal SG6 that is obtained by performing only the waveform shaping on the converted voltage signal SG2 without demodulating the converted voltage signal SG2 that is output by the voltage sensor 14.

The converted current signal determiner 26 is connected to both of an output terminal of the current-voltage converter 22 and an input terminal of the demodulator/waveform shaper 23. Upon inputting of the converted current signal SG1 that has been output by the current-voltage converter 22, the converted current signal determiner 26 determines whether or not the converted current signal SG1 generated by the current-voltage converter 22 meets a preset condition, thereby determining whether or not the converted current signal SG1 has been generated by the transmission of the current signal over the communication lines L1.

More specifically, upon inputting of the converted current signal SG1 that has been output by the current-voltage converter 22, the converted current signal determiner 26 outputs a detection signal SG3 indicating that the converted current signal SG1 is generated by the transmission of the current signal over the communication lines L1, when a voltage value of the converted current signal SG1 is equal to or greater than a preset threshold value, the signal length of the converted current signal SG1 has a certain duration (for example, by a length of 1-bit when the communication scheme is based on a baseband scheme), and the voltage value of the converted current signal SG1 is within a specified range. That is, the converted current signal determiner 26 outputs a detection signal SG3 unless the converted current signal SG1 generated by the current-voltage converter 22 indicates, for example, a detection of noises or the like. The preset threshold value and the specified range are determined beforehand according to an amplitude value of the converted current signal SG1.

Note that the converted current signal determiner 26 outputs no detection signal SG3 when the voltage value of the converted current signal SG1 is smaller than the preset threshold value or when the signal length of the converted current signal SG1 is shorter than the certain duration, since it is a detection of noises and the like.

As discussed above, the converted current signal determiner 26 determines, based on the preset threshold value and the signal length, whether or not the converted current signal SG1 is generated by the transmission of the current signal over the communication lines L1, thereby preventing a false output of the detection signal SG3 when noises and the like are detected.

Moreover, the converted current signal determiner 26 determines that the converted current signal SG1 indicates an anomalous value, and outputs an error signal representing an anomaly and being included within the detection signal SG3, when the voltage value of the converted current signal SG1 is equal to or greater than a preset threshold even though the voltage value of the converted current signal SG1 exceeds the specified range, and the signal length of the converted current signal SG1 has the certain duration.

The converted voltage signal determiner 27 is connected to both of an output terminal of the voltage sensor 14 and an input terminal of the modulator/waveform shaper 25. Upon inputting of the converted voltage signal SG2 that has been output by the voltage sensor 14, the converted voltage signal determiner 27 determines whether or not the converted voltage signal SG2 generated by the voltage sensor 14 meets a predetermined condition, thereby determining whether or not the converted voltage signal SG2 is generated by transmission of the voltage signal over the communication lines L2.

More specifically, upon inputting of the converted voltage signal SG2 that has been output by the voltage sensor 14, the converted voltage signal determiner 27 outputs a detection signal SG4 indicating that the converted voltage signal SG2 is generated by the transmission of the voltage signal over the communication lines L2, when the voltage value of the converted voltage signal SG2 is equal to or greater than the predetermined threshold value, the signal length of the converted voltage signal SG2 has a certain duration (for example, a length of 1-bit when the communication scheme is based on a baseband scheme), and the voltage value of the converted voltage signal SG2 is within a prescribed range. That is, the converted voltage signal determiner 27 outputs the detection signal SG4 unless the converted voltage signal SG2 generated by the voltage sensor 14 indicates, for example, a detection of noises. In this case, the predetermined threshold value and the prescribed range are determined in advance based on an amplitude value of the converted voltage signal SG2.

Note that the converted voltage signal determiner 27 outputs no detection signal SG4, when the voltage value of the converted voltage signal SG2 is smaller than the predetermined threshold value or the signal length of the converted voltage signal SG2 is shorter than the certain duration, since it is a detection of noises and the like.

As discussed above, the converted voltage signal determiner 27 determines, based on the predetermined threshold and the signal length, whether or not the converted voltage signal SG2 is generated by the transmission of the voltage signal over the communication lines L2, thereby preventing a false output of the detection signal SG4 when noises and the like are detected.

Moreover, the converted voltage signal determiner 27 determines that the converted voltage signal SG2 indicates an anomalous value, and outputs an error signal representing an anomaly and being included in within the detection signal SG4 when the voltage value of the converted voltage signal SG2 is equal to or larger than the predetermined threshold even though the voltage value of the converted voltage signal SG2 exceeds the prescribed range, and the signal length of the converted voltage signal SG2 has the certain duration.

The switcher 28 is connected to both of the converted current signal determiner 26 and the converted voltage signal determiner 27. Given that the generation of the converted current signal SG1 by the transmission of the current signal over the communication lines L1 has already been determined by the converted current signal determiner 26 when a detection signal SG3 not containing any error signal is received, the switcher 28 switches over the switch 29 to have the output terminal of the demodulator/waveform shaper 23 connected to the input terminal of the extractor/signal determiner 30 in order to transmit the command signal SG5 (signal obtained by the demodulation and waveform shaping of the converted current signal SG1) that is output by the demodulator/waveform shaper 23 to the extractor/signal determiner 30 and to the display information generator/outputter 31. Accordingly, the output terminal of the demodulator/waveform shaper 25 and the input terminal of the extractor/signal determiner 30 are disconnected. That is, no command signal SG6 is transmitted to the extractor/signal determiner 30 and to the display information generator/signal outputter 31 although the command signal SG6 is output by the demodulator/waveform shaper 25.

Given that the generation of the converted voltage signal SG2 by the transmission of the voltage signal over the communication lines L2 has already been determined by the converted voltage signal determiner 27 when the detection signal SG4 not containing any error signal is received, the switcher 28 switches over the switch 29 to have the output terminal of the demodulator/waveform shaper 25 connected to the input terminal of the extractor/signal determiner 30 in order to transmit the command signal SG6 (signal obtained by the demodulation and waveform shaping of the converted voltage signal SG2) that is output by the demodulator/waveform shaper 25 to the extractor/signal determiner 30 and to the display information generator/outputter 31. Accordingly, the output terminal of the demodulator/waveform shaper 23 and the input terminal of the extractor/signal determine 30 are disconnected. That is, no command signal SG5 is transmitted to the extractor/signal determiner 30 and to the display information generator/signal outputter 31 although the command signal SG5 is output by the demodulator/waveform shaper 23.

Once the switch 29 is switched over, the switcher 28 does not switch-over the switch 29 until a predetermined period of time (for example, by a length of 1-bit when the communication scheme is based on a baseband scheme) elapses. The switcher 28 therefore prevents the switch 29 from being switched during reception of the current signal or the voltage signal.

Note that when the detection signal SG3 containing an error signal is received, the converted current signal SG1 is generated by transmission of the current signal over the communication lines L1, but since this converted current signal SG1 has been determined by the converted current signal determiner 26 as indicating an anomalous value, which indicating a possible occurrence of an anomaly and the like within a communication unit, the switcher 28 thus disconnects the connection between the demodulator/waveform shaper 23 and the extractor/signal determiner 30 to suppress a transmission of a signal indicating an anomaly to the extractor/signal determiner 30. In other words, the switcher 28 switches over the switch 29 when the detection signal SG3 containing an error signal is received in order to have the voltage signal receiver 24 (demodulator/waveform shaper 25) connected to the extractor/signal determiner 30.

In addition, when the detection signal SG4 containing an error signal is received, the converted voltage signal SG2 is generated by transmission of the voltage signal over the communication lines L2, but since this converted voltage signal SG2 has been determined by the converted voltage signal determiner 27 as indicating an anomalous value, which indicates a possible occurrence of an anomaly within the communication unit, the switcher 28 thus disconnects the connection between the demodulator/waveform shaper 25 and the extractor/signal determiner 30 to prevent a transmission of the signal indicating an anomaly to the extractor/signal determiner 30. In other words, the switcher 28 switches over the switch 29 to achieve a connection of the current signal receiver 21 (demodulator/waveform shaper 23) to the extractor/signal determiner 30.

The switcher 28 thus prevents a reception of a signal indicating an anomaly by performing the switch-over of the switch 29 as discussed above.

Note that the switcher 28 includes a memory 28a that stores a preferential order indicating whether to preferentially transmit the command signal SG5 to the extractor/signal determiner 30 or to preferentially transmit the command signal SG6 to the extractor/signal determiner 30. The switcher 28 determines, regardless of the presence of the error signal, a command signal that is transmitted to the extractor/signal determiner 30 and to the display information generator/outputter 31 according to the preferential order that is set by the user in advance, when receiving the detection signal SG3 (signal corresponding to the command signal SG5) and the detection signal SG4 (signal corresponding to the command signal SG6) at the same timing, and switches over the switch 29.

That is, the switcher 28 determines the command signal for transmitting to the extractor/signal determiner 30 and to the display information generator/outputter 31 according to the preferential order stored in the memory 28a and switches over the switch 29 when the timing for the converted current determiner 26 to determine that the converted current signal SG1 has been generated by the transmission of the current signal over the communication lines L1 coincides with the timing for the converted voltage signal determiner 27 to determine that the converted voltage signal SG2 has been generated by the transmission of the voltage signal over the communication lines L2.

The switcher 28 is therefore capable of transmitting the command signal (the command signal SG5 or the command signal SG6) to the extractor/signal determiner 30 and to the display information generator/outputter 31 by switching over the switch 29 according to the preferential order even though the timing of the current signal transmission coincides with the timing of the voltage signal transmission.

In the first embodiment, the command signal SG5 is set by the switcher 28 as a command signal that is transmitted to the extractor/signal determiner 30 when the detection signal SG3 and the detection signal SG4 are received at the same timing.

The switch 29 has respective one terminals of two pairs of switch terminals connected to the output terminal of the demodulator/waveform shaper 23 on the current signal receiver 21, and the respective other terminals of the switch terminals are connected to the output terminal of the demodulator/waveform shaper 25 on the voltage signal receiver 24. A fixed terminal of the switch 29 is connected to the input terminal of the extractor/signal determiner 30. The switch 29 changes the destination of the connection of the extractor/signal determiner 30 to either one of the demodulator/waveform shaper 23 of the current signal receiver 21 and the demodulator/waveform shaper 25 of the voltage signal receiver 24.

Figure 3:
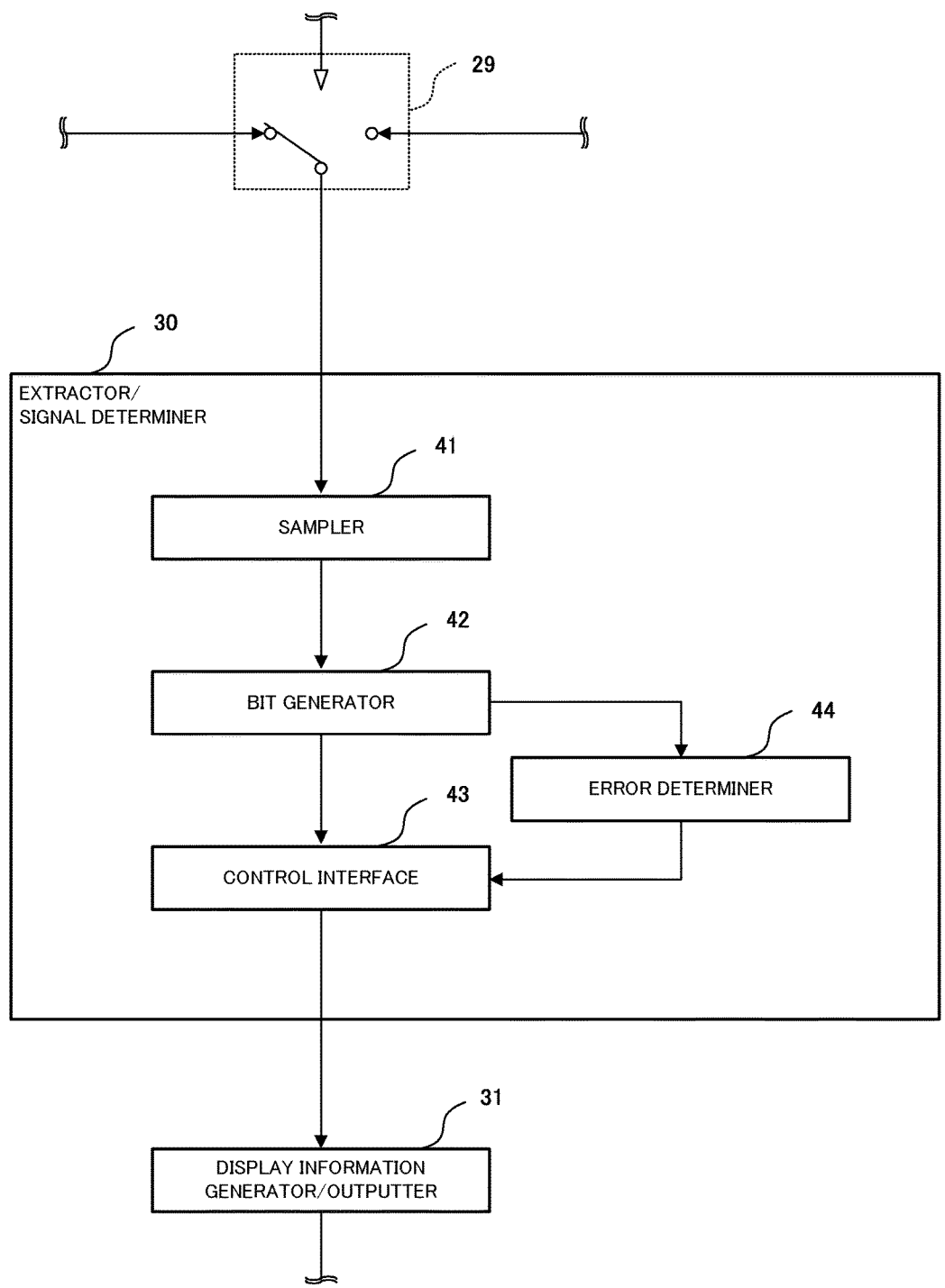
FIG. 3 is a block diagram illustrating an extractor/signal determiner.

The extractor/signal determiner 30 carries out both current signal extraction and the like from the command signal SG5 (signal corresponding to the converted current signal SG1) and voltage signal extraction and the like from the command signal SG6 (signal corresponding to the converted voltage signal SG2). As illustrated in FIG. 3, the extractor/signal determiner 30 includes a sampler 41, a bit generator 42, a control interface 43, and an error determiner 44.

The sampler 41 is connected to the fixed terminal of the switch 29. Upon receiving a command signal (command signal SG5 or command signal SG6), the sampler 41 performs sampling on the received command signal at a predetermined sampling interval and outputs a command signal (sampling value) having undergone sampling.

The bit generator 42 is connected to an output terminal of the sampler 41. Upon receiving the sampling value, the bit generator 42 obtains a bit value from the received sampling value and outputs the obtained bit value. That is, the bit generator 42 outputs a current signal represented by a bit value that corresponds to the command signal SG5 or a voltage signal represented by a bit value that corresponds to the command signal SG6.

When, for example, eight sets of sampling are performed by the sampler 41 on one of the constituent values of the command signal (command signal SG5 or command signal SG6), the bit generator 42 sorts out the sampling values of, for example, the fourth, the fifth, and the sixth sampling values into the sampling values that exceed a threshold and the ones that do not exceed the threshold. In addition, the bit generator 42 sets a bit value to be "1" when, for example, there are more sampling values that exceed the threshold than those do not exceed the threshold, and sets a bit value to be "0" when there are less sampling values that exceed the threshold than those that do not exceed the threshold, and the bit generator 42 outputs the bit value.

In this way, the bit generator 42 extracts the current signal from the command signal SG5 (signal corresponding to the converted current signal SG1) and extracts the voltage signal from the command signal SG6 (signal corresponding to the converted voltage signal SG2).

The error determiner 44 is connected to one of two output terminals of the bit generator 42. Upon receiving a bit value (a current signal or a voltage signal) corresponding to a command signal, the error determiner 44 determines whether or not any errors, such as a parity bit error, or a framing error, have occurred in the received bit value. The error determiner 44 generates and outputs error information indicating the details of an error when the error has occurred within a bit value that corresponds to the command signal. In this way, the error determiner 44 determines whether or not any error has occurred in the current signal or in the voltage signal, and when an occurrence of an error is found, outputs the error information indicating the occurrence of the error.

The control interface 43 is serving as an interface to the display information generator/outputter 31. The control interface 43 is connected to the output terminal of the bit generator 42 and the output terminal of the error determiner 44. The control interface 43 generates determined-signal information that is a collection of information containing a bit value (a current signal or a voltage signal) that corresponds to the command signal output by the bit generator 42, and the error information that is output by the error determiner 44, and outputs this determined-signal information to the display information generator/outputter 31. In this case, when no error information is output by the error determiner 44, the control interface 43 generates determined-signal information represented by a bit value corresponding to a command signal containing no error information.

Note that when receiving either one of the bit value corresponding to the command signal and the error information, the control interface 43 outputs an interrupt signal to the display information generator/outputter 31. The display information generator/outputter 31 then outputs a request signal requesting determined-signal information to the control interface 43. In response to this request signal, the control interface 43 outputs the determined-signal information to the display information generator/outputter 31. Thus, the determined-signal information can be received by the display information generator/outputter 31.

The display information generator/outputter 31 illustrated in FIG. 2 is connected to the extractor/signal determiner 30. Upon receiving the determined-signal information (signal that may contain, in addition to a bit value corresponding to the command signal, error information), the display information generator/outputter 31 performs analysis and the like on the communication details based on the received determined-signal information.

Figure 4:
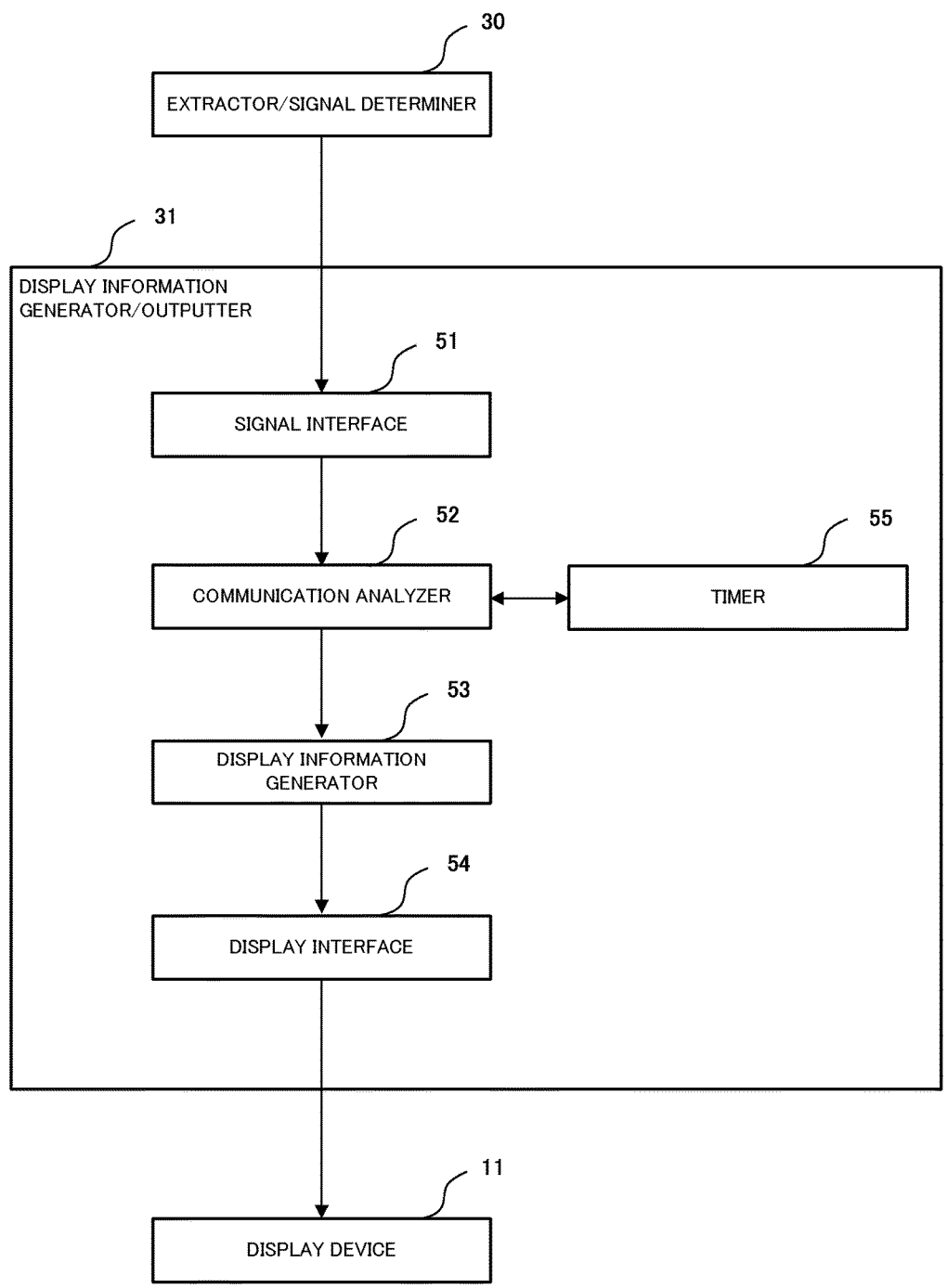
FIG. 4 is a block diagram illustrating a display information generator/outputter.

As illustrated in FIG. 4, the display information generator/outputter 31 includes a signal interface 51, a communication analyzer 52, a display information generator 53, a display interface 54, and a timer 55.

The signal interface 51 serves as an interface to the extractor/signal determiner 30. The signal interface 51 is connected to the output terminal of the extractor/signal determiner 30. Upon receiving the determined-signal information (signal that may contain, in addition to a bit value corresponding to the command signal, error information), the signal interface 51 outputs this determined-signal information to the communication analyzer 52.

The communication analyzer 52 is connected to both of an output terminal of the signal interface 51 and an output terminal of the timer 55. Upon receiving the determined-signal information (signal that may contain, in addition to the bit value corresponding to the command signal, error information), the communication analyzer 52 obtains communication frame information from a bit value (a current signal or a voltage signal) corresponding to the command signal (command signal SG5 or command signal SG6) and acquires time information indicating the time from the timer 55. Next, the communication analyzer 52 outputs information that is the communication frame information associated with the time information. Note that the communication frame information contains, for example, in addition to the current signal or the voltage signal, a sender address of the current signal or that of the voltage signal, and a destination address and the like of the current signal or that of the voltage signal.

The display information generator 53 is connected to the communication analyzer 52. Upon receiving information having the communication frame information (information generated from either one of the command signal SG5 or the command signal SG6) associated with the time information, the display information generator 53 generates display information having converted to the information in a format displayable on the display device 11. Note that, based on the time information contained in this display information, the display device 11 for receiving display information can identify the time at which the display information is generated.

The display interface 54 serves as an interface to the display device 11. The display interface 54 is connected to an output terminal of the display information generator 53. The display interface 54 outputs, upon receiving the display information, this display information to the display device 11.

Note that when receiving the display information, the display interface 54 outputs an interrupt signal to the display device 11. In this case, the display device 11 outputs a request signal requesting the display information to the display interface 54. In response to this request signal, the display interface 54 outputs the display information to the display device 11. The display device 11 is thus capable of receiving the display information.

The timer 55 clocks the time.

As illustrated in FIG. 2, the display device 11 is connected to the display information generator/outputter 31. The display device 11 displays, upon receiving the display information, the received display information.

Figure 5:
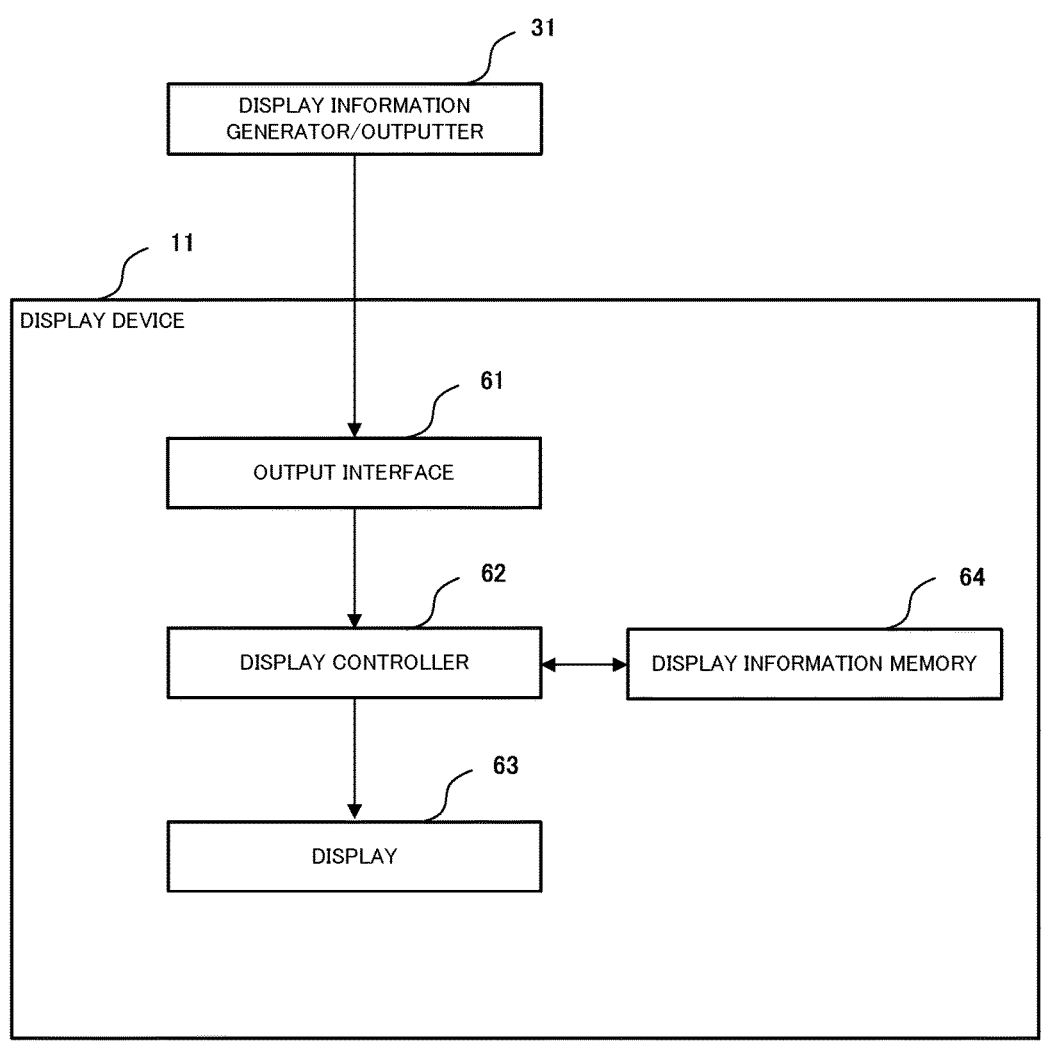
FIG. 5 is a block diagram illustrating a display device.

As illustrated in FIG. 5, the display device 11 includes an output interface 61, a display controller 62, a display 63, and a display information memory 64.

The output interface 61 serves as an interface to the display information generator/outputter 31. The output interface 61 is connected to the output terminal of the display information generator/outputter 31. Upon receiving the display information, the output interface 61 outputs the display information to the display controller 62. In a case in which a plurality of analysis devices 10 is installed, every display information generator/outputter 31 of the analysis devices 10 (in the first embodiment, the analysis device 10-1 and the analysis device 10-2) is connected to the output interface 61.

The display controller 62 is connected to the output interface 61. The display controller 62 stores, upon receiving the display information, the received display information in the display information memory 64. When a plurality of analysis devices 10 is connected to the output interface 61, the received display information is stored in the display information memory 64 in association with the information representing the sender of the display information (for example, a media access control address (MAC) of the analysis device 10).

Subsequently, the display controller 62 reads out every display information stored in the display information memory 64 when equal to or greater than the necessary number of display information for displaying on the screen are stored in the display information memory 64. Next, the display controller 62 associates respective pieces of display information based on the time information contained in the read display information, and puts each piece of the display information into a unified format so that every piece of display information is displayable on a single screen. After that, the display controller 62 outputs the unified display information.

The display 63 is connected to an output terminal of the display controller 62. The display 63 is, for examples, a liquid crystal display. The display 63 generates, upon receiving the unified display information, a screen using this display information, and displays the screen.

The display information memory 64 is connected to input and output terminals of the display controller 62. The display information memory 64 is, for example, a flash memory. The display information memory 64 stores the display information received by the display controller 62.

Figure 6:
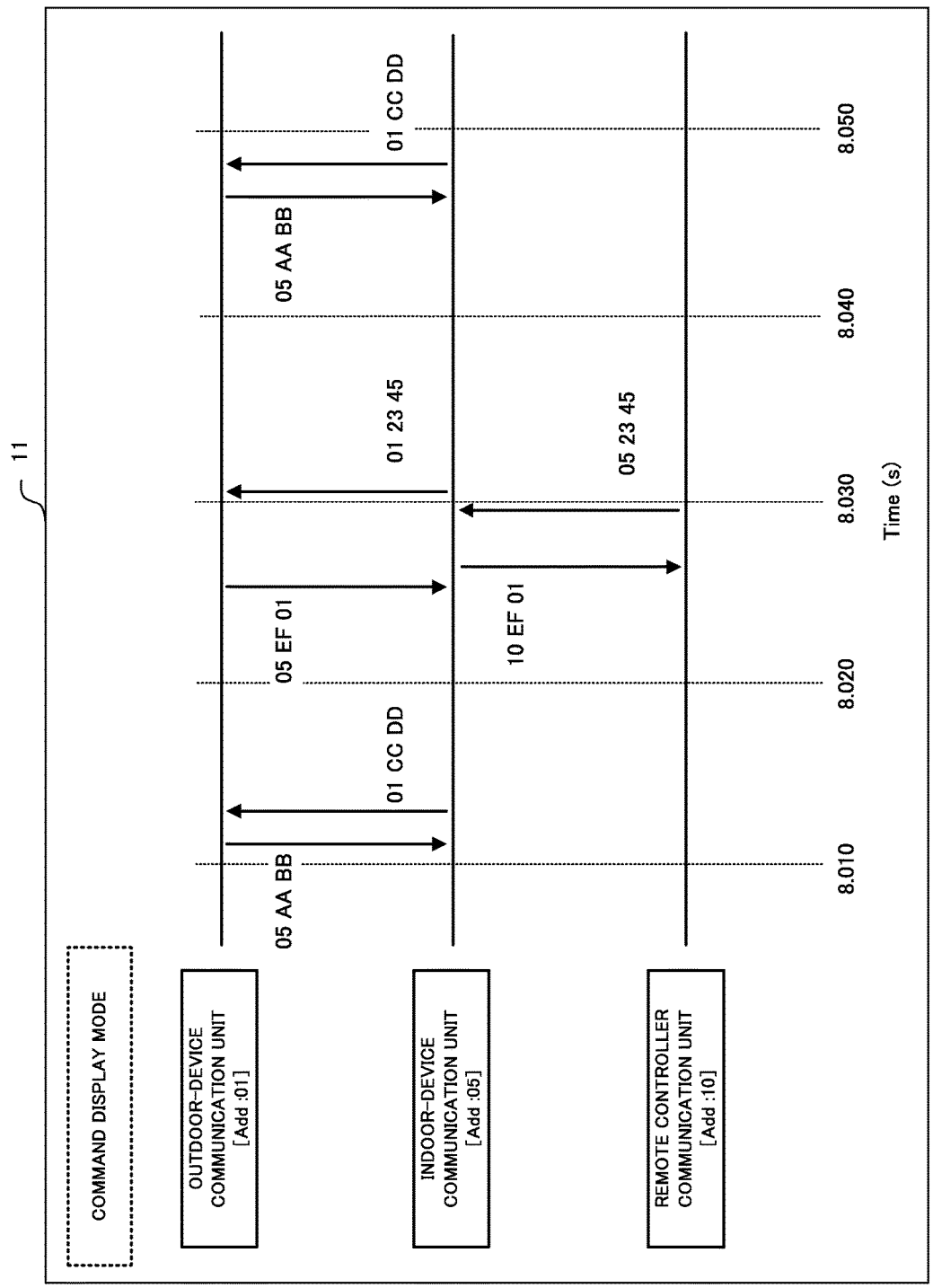
FIG. 6 illustrates an example screen for a command display mode.

The screen displayed on the display 63 of the display device 11 as discussed above is, for example, a screen for a command display mode illustrated in FIG. 6. Displayed on this screen are, for each communication unit, commands contained in the current signal that are exchanged between the outdoor-device communication unit 100 and the indoor-device communication unit 110, and commands contained in the voltage signal that are exchanged between the indoor-device communication unit 110 and the remote controller communication unit 120. In addition, this screen displays the commands in association with each other based on the time (the time at which the display information is generated) identified by the time information. This screen displays that, for example, immediately after 8.010 seconds, a command, "05 AA BB", is sent by the outdoor-device communication unit 100 to the indoor-device communication unit 110, and then a command, "01 CC DD", is sent by the indoor-device communication unit 110 to the outdoor-device communication unit 100. This screen enables the user to analyze the command exchanging status.

Figure 7:
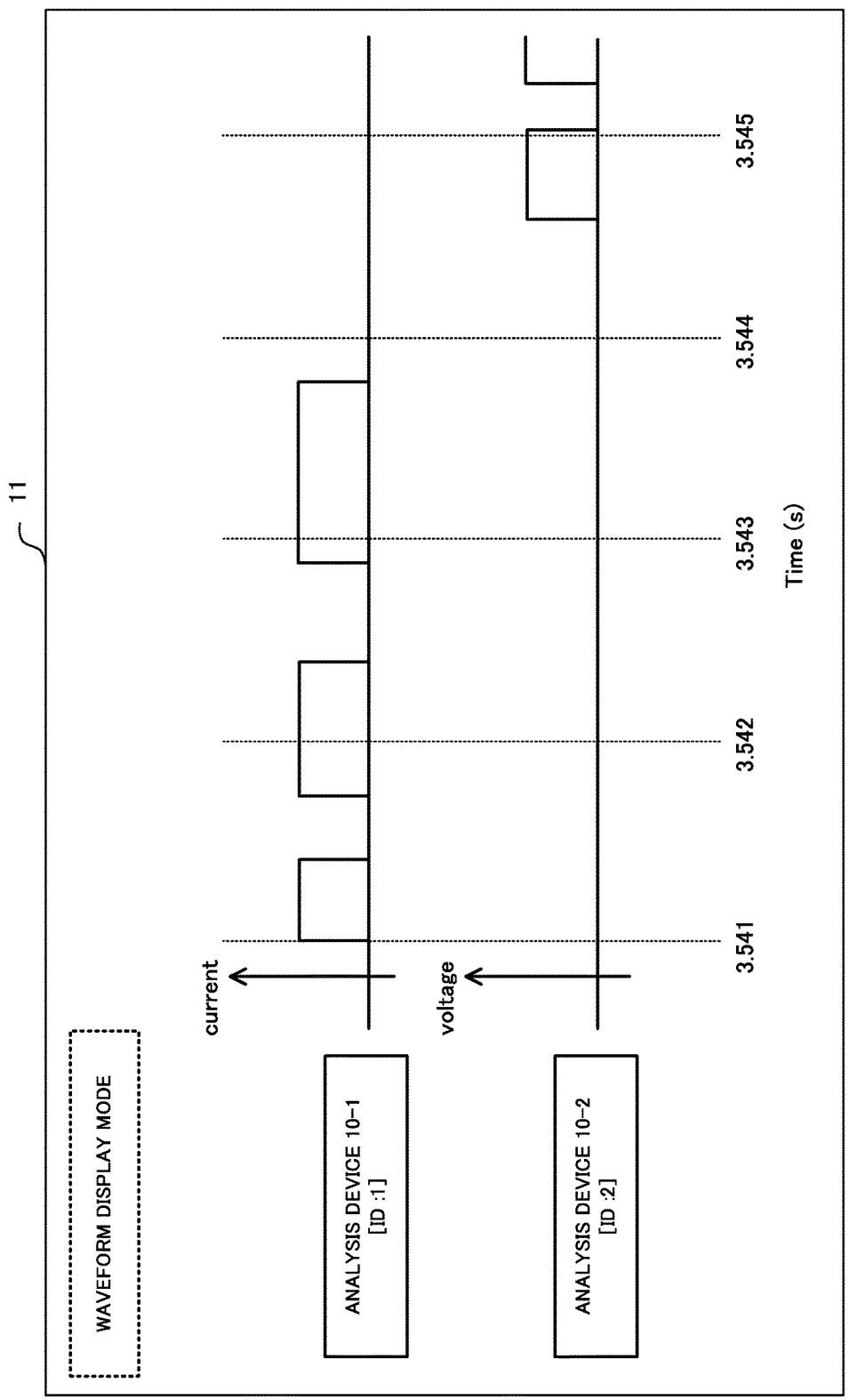
FIG. 7 illustrates an example screen for a waveform display mode.

The screen that is displayed on the display 63 of the display device 11 includes, for example, a waveform display mode illustrated in FIG. 7. This screen shows, for each analysis device, a waveform of a current signal received by the analysis device 10-1 and a waveform of a voltage signal received by the analysis device 10-2. The screen that shows those signal waveforms is generated by arranging, in time series, bit values corresponding to a command signal (command signal SG5 or command signal SG6), which in other words, by arranging, in time series, the current signal or the voltage signal based on the time (the time at which the display information is generated) identified by the time information. This screen enables the user to perform the waveform analysis on signals.

Figure 8:
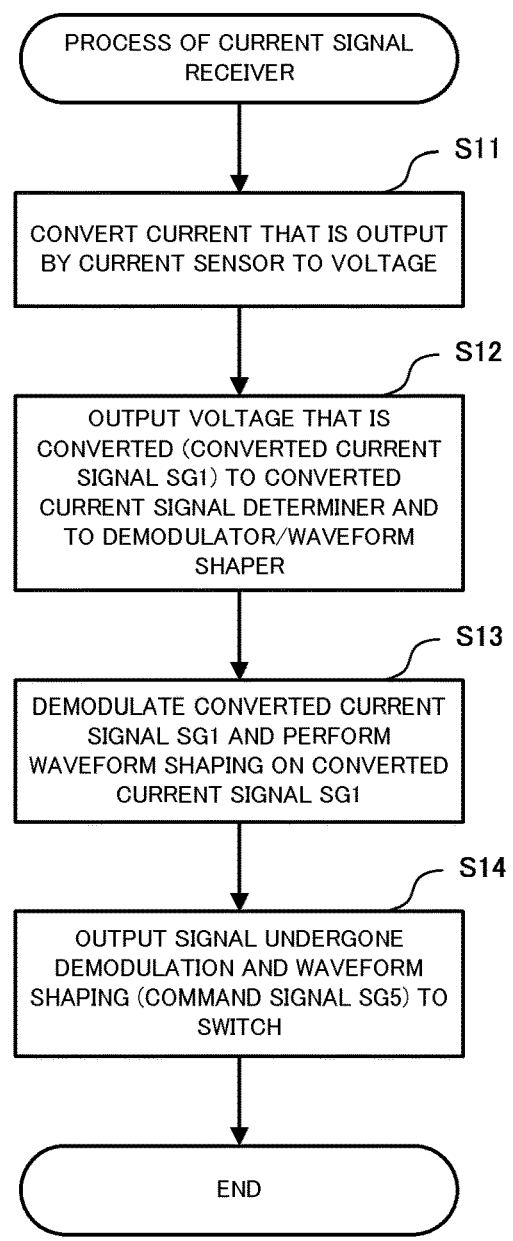
FIG. 8 is a flowchart illustrating a process of a current signal receiver.

The analysis device 10 (the analysis device 10-1 and the analysis device 10-2) discussed above initiates processes of the current signal receiver illustrated in FIG. 8 through the current signal receiver 21 when power is turned ON and a current is output by the current sensor 13.

The processes of the current signal receiver begin with converting the current that is output by the current sensor 13 to a voltage to generate the converted current signal SG1 through the current-voltage converter 22 of the current signal receiver 21 (step S11). In the step S11, when a current of, for example, 20 mA is output by the current sensor 13, the current-voltage convertor 22 converts this current to a voltage signal of 5 volts. When a current of, for example, 4 mA is output by the current sensor 13, the current-voltage convertor 22 converts this current to a voltage signal of 1 volt.

Subsequently, the current-voltage convertor 22 outputs the converted current signal SG1 to the converted current signal determiner 26 and also outputs the converted current signal SG1 to the demodulator/waveform shaper 23 (step S12). Note that in the step S12, when the converted current signal SG1 that is output by the current-voltage convertor 22 is received by the converted current signal determiner 26, the process of the converted current signal determiner illustrated in FIG. 9, which will be discussed later, is initiated.

After executing the step S12, the demodulator/waveform shaper 23 demodulates and performs a waveform shaping on the converted current signal SG1 that is output by the current-voltage convertor 22 (step S13). Next, the demodulator/waveform shaper 23 outputs the signal having undergone the demodulation and the waveform shaping (command signal SG5) to respective one terminals of the two pairs of switch terminals and completes the process of the current signal receiver (step S14).

Figure 9:
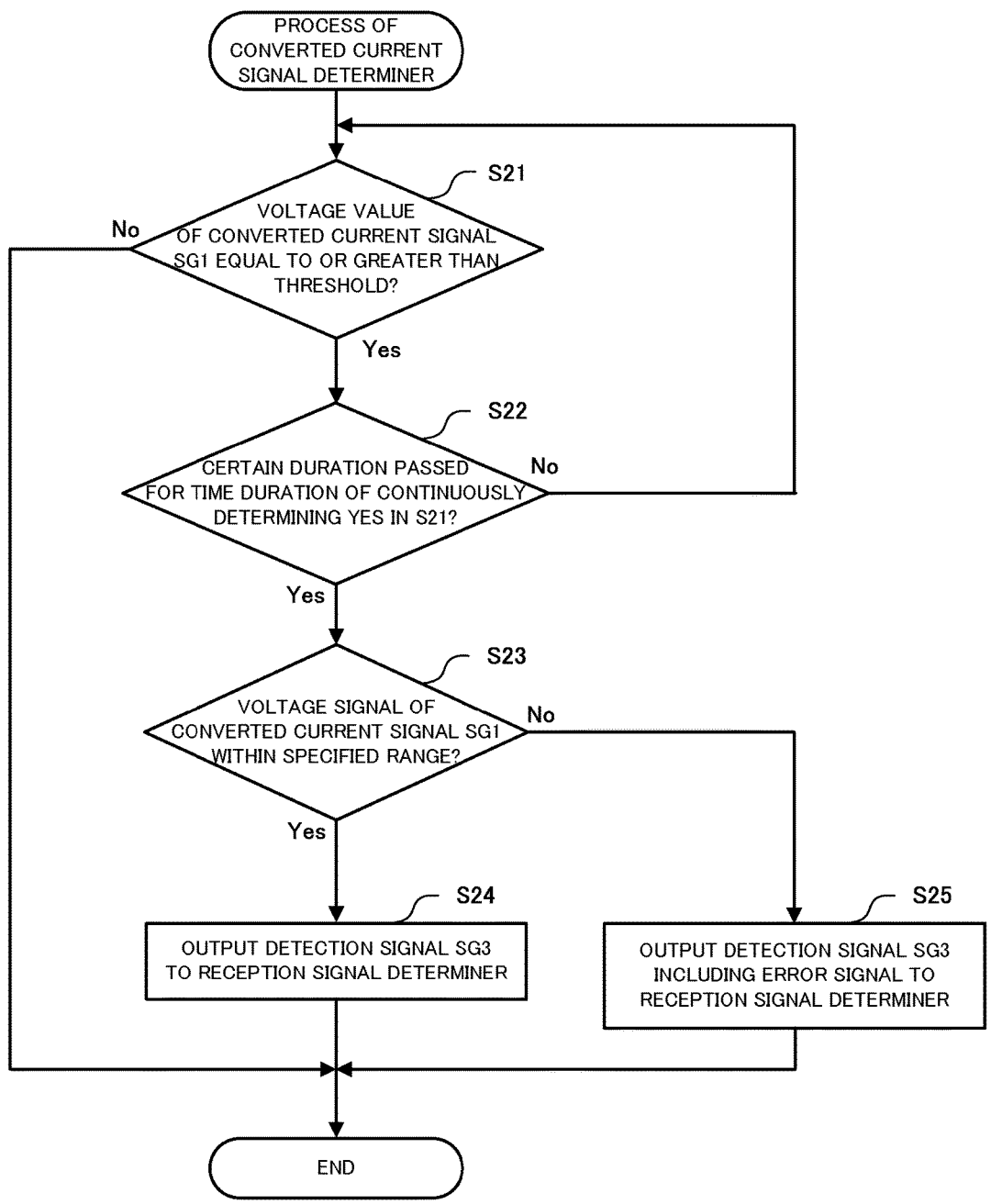
FIG. 9 is a flowchart illustrating a process of a converted current signal determiner.

After executing the step S12, when the converted current signal SG1 that is output by the current-voltage convertor 22 is received by the converted current signal determiner 26, the converted current signal determiner 26 initiates the process of the converted current signal determiner illustrated in FIG. 9.

The process of the converted current signal determiner begins with a determination on whether or not the voltage value of the voltage signal (converted current signal SG1) that is output by the current-voltage convertor 22 is equal to or greater than a preset threshold value (step S21). The converted current signal determiner 26 terminates this process when determining that the converted current signal SG1 is smaller than the preset threshold value (step S21; No) because this indicates the detection of noises and the like.

Conversely, when determining that the converted current signal SG1 is equal to or greater than the preset threshold value (step S21; Yes), the converted current signal determiner 26 determines whether this same determined results are continuously drawn over the certain duration of time, thereby determining whether or not the signal length of the converted current signal SG1 has the certain duration (for example, by a length of 1-bit when the communication scheme is based on a baseband scheme) (step S22). When determining that the duration of time for continuously determining "Yes" in S21 is shorter than the certain duration (step S22; No), the converted current signal determiner 26 returns the process to the step S21. According to the determinations in the step S22 and the step S21, when the signal length of the converted current signal SG1 is shorter than the certain duration even though the voltage signal of the converted current signal SG1 is equal to or greater than the preset threshold value, the converted current signal determiner 26 eventually determines "No" in the step S21. Hence, the converted current signal determiner 26 executes a similar process to that of the detection of noises and the like for the converted current signal SG1 having a signal length shorter than the certain duration. In this case, with regard to a determination on whether or not the duration of time for continuously determining "Yes" in S21 exceeds the certain duration, the converted current signal determiner 26 may be provided with, for example, a timer and that the time duration measured by the timer can be used for the converted current signal determiner 26.

In the step S22, when determining that the time duration for continuously determining "Yes" in S21 exceeds the certain duration (step S22; No), the converted current signal determiner 26 determines whether or not the voltage value of the converted current signal SG1 is within the specified range (step S23). When determining that the voltage value of the converted current signal SG1 is within the specified range (step S23; Yes), the converted current signal determiner 26 outputs, to the switcher 28, the detection signal SG3 indicating that the converted current signal SG1 is generated by transmission of the current signal over the communication lines L1, and terminates this process (step S24).

Conversely, when determining that the voltage value of the converted current signal SG1 is out of the specified range (step S23; No), the converted current signal determiner 26 outputs, to the switcher 28, the detection signal SG3 including an error signal because the voltage value of the converted current signal SG1 is beyond the specified range of voltage, whereas an anomaly in the converted current signal SG1 is found, even though the voltage value of the converted current signal SG1 is equal to or greater than the preset threshold value, and the signal length of the converted current signal SG1 includes the certain duration. Thereafter, the converted current signal determiner terminates this process (step S25).

Figure 10:
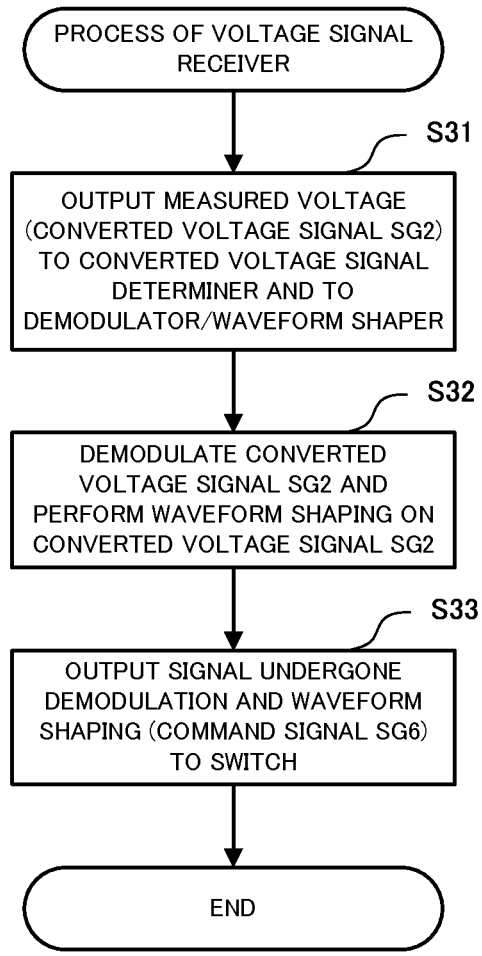
FIG. 10 is a flowchart illustrating a process of a voltage signal receiver.

In addition to the process explained above, having turned ON the power of the analysis device 10 (the analysis device 10-1 and the analysis device 10-2) and the voltage signal being output by the voltage sensor 14, the process of the voltage signal receiver illustrated in FIG. 10 is initiated by the voltage signal receiver 24.

In the process of the voltage signal receiver, the voltage signal receiver 24 outputs the converted voltage signal SG2 generated by the voltage sensor 14 to the converted voltage signal determiner 27 and to the demodulator/waveform shaper 25 (step S31). When the converted voltage signal SG2 that is output by the voltage signal receiver 24 in the step S31 is received, the process of the converted voltage signal determiner 27 illustrated in FIG. 11, which will be discussed later, is initiated.

After executing the step S31, the demodulator/waveform shaper 25 demodulates and performs a waveform shaping on the converted voltage signal SG2 that is output by the voltage signal receiver 24 (step S32). Subsequently, the demodulator/waveform shaper 25 outputs the signal (command signal SG5) having undergone the demodulation and the waveform shaping to the respective other terminals of the two pairs of switch terminals, and terminates the process of the voltage signal receiver (step S35).

Figure 11:
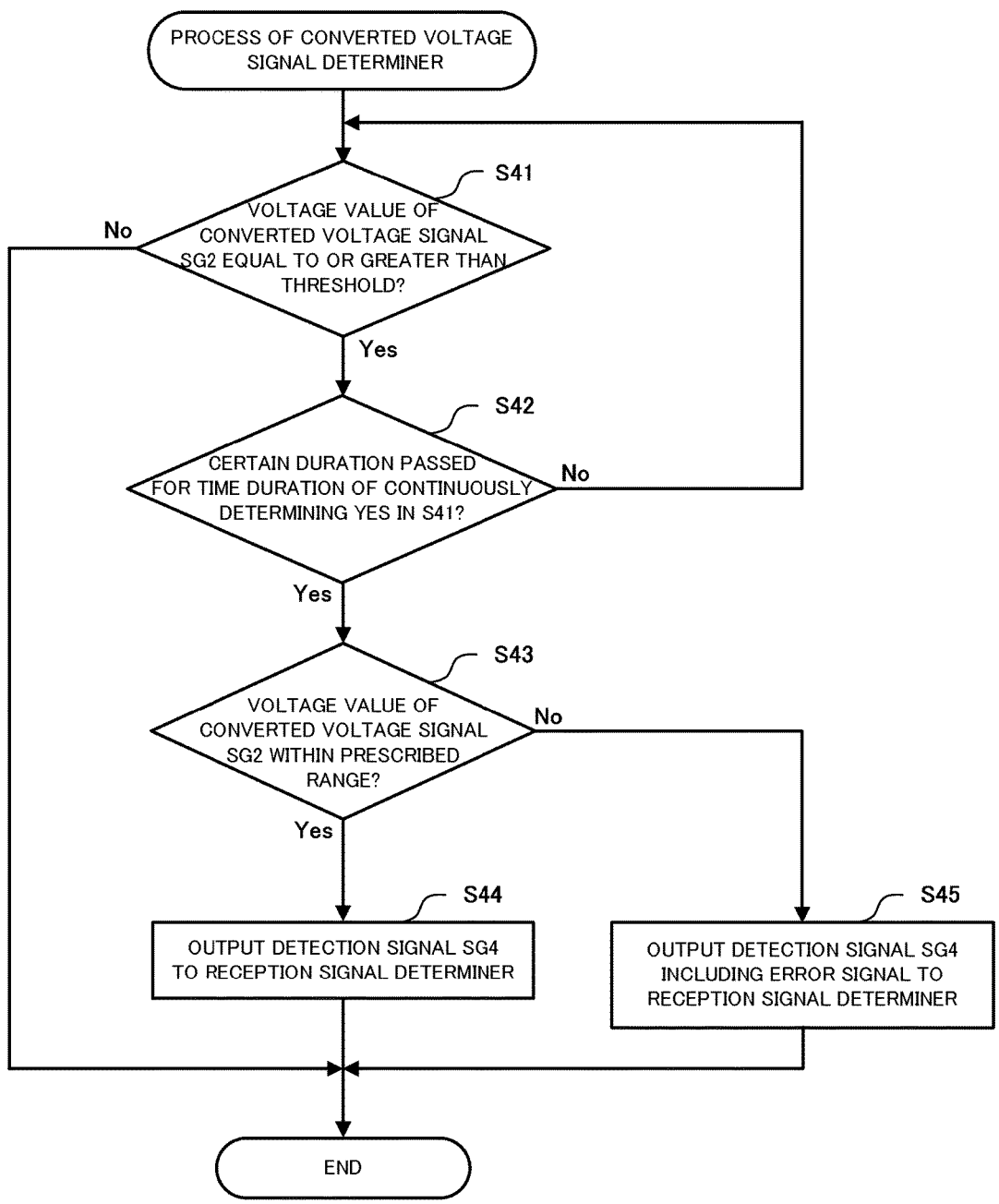
FIG. 11 is a flowchart illustrating a process of a converted voltage signal determiner.

After executing the step S31, when the converted voltage signal SG2 output by the voltage signal receiver 24 is received by the converted voltage signal determiner 27, the converted voltage signal determiner 27 initiates the process of the converted voltage signal determiner illustrated in FIG. 11.

The process of the converted voltage signal determiner is initiated by the converted voltage signal determiner 27 determining whether the voltage value of the voltage signal (converted voltage signal SG2) that is output by the voltage signal receiver 24 is equal to or greater than the predetermined threshold value (step S41). When determining that the converted voltage signal SG2 is smaller than the predetermined threshold value (step S41; No), the converted voltage signal determiner 27 terminates the process because this is the detection of noises and the like.

Conversely, when determining that the converted voltage signal SG2 is equal to or greater than a predetermined threshold value (step S41; Yes), the converted voltage signal determiner 27 determines whether or not the same determined results are continuously drawn over the certain duration of time, thereby determining whether or not the signal length of the converted voltage signal SG2 has the certain duration (for example, by a length of 1-bit when the communication scheme is based on a baseband scheme) (step S42). When determining that the time duration for continuously determining "Yes" in S41 does not exceed the certain duration (step S42; No), the converted voltage signal determiner 27 returns the process to the step S41. According to the determinations in the step S42 and the step S41, when the signal length of the converted voltage signal SG2 is shorter than the certain duration even though the voltage signal of the converted voltage signal SG2 is equal to or greater than the predetermined threshold value, the converted voltage signal determiner 27 eventually determines "No" in the step S41. Hence, the converted voltage signal determiner 27 executes a similar process to that of the detection of noises and the like for the converted voltage signal SG2 having the signal length shorter than the certain duration. In this case, with regard to a determination on whether or not the duration of time for continuously determining "Yes" in S41 exceeds the certain duration, the converted voltage signal determiner 27 may be provided with, for example, a timer and that the time duration measured by the timer can be used by the converted voltage signal determiner 27.

In the step S42, when determining that the time duration for continuously determining "Yes" in S41 exceeds the certain duration (step S42; No), the converted voltage signal determiner 27 determines whether or not the voltage value of the converted voltage signal SG2 is within the prescribed range (step S43). When determining that the voltage value of the converted voltage signal SG2 is within the prescribed range (step S43; Yes), the converted voltage signal determiner 27 outputs, to the switcher 28, the detection signal SG4 indicating that the converted voltage signal SG2 is generated by transmission of the voltage signal over the communication lines L2. Thereafter, the converted voltage signal determiner terminates this process (step S44).

Conversely, when determining that the voltage vale of the converted voltage signal SG2 is out of the prescribed range (step S43; No), the converted voltage signal determiner 27 outputs, to the switcher 28, the detection signal SG4 including an error signal because the voltage value of the converted voltage signal SG2 is beyond the prescribed range, whereas the converted voltage signal SG2 indicates an anomaly, even though the signal length of the converted voltage signal SG2 is equal to or greater than the predetermined threshold value and the signal length of the converted voltage signal SG2 includes the certain duration, and terminate this process (step S45).

Figure 12:
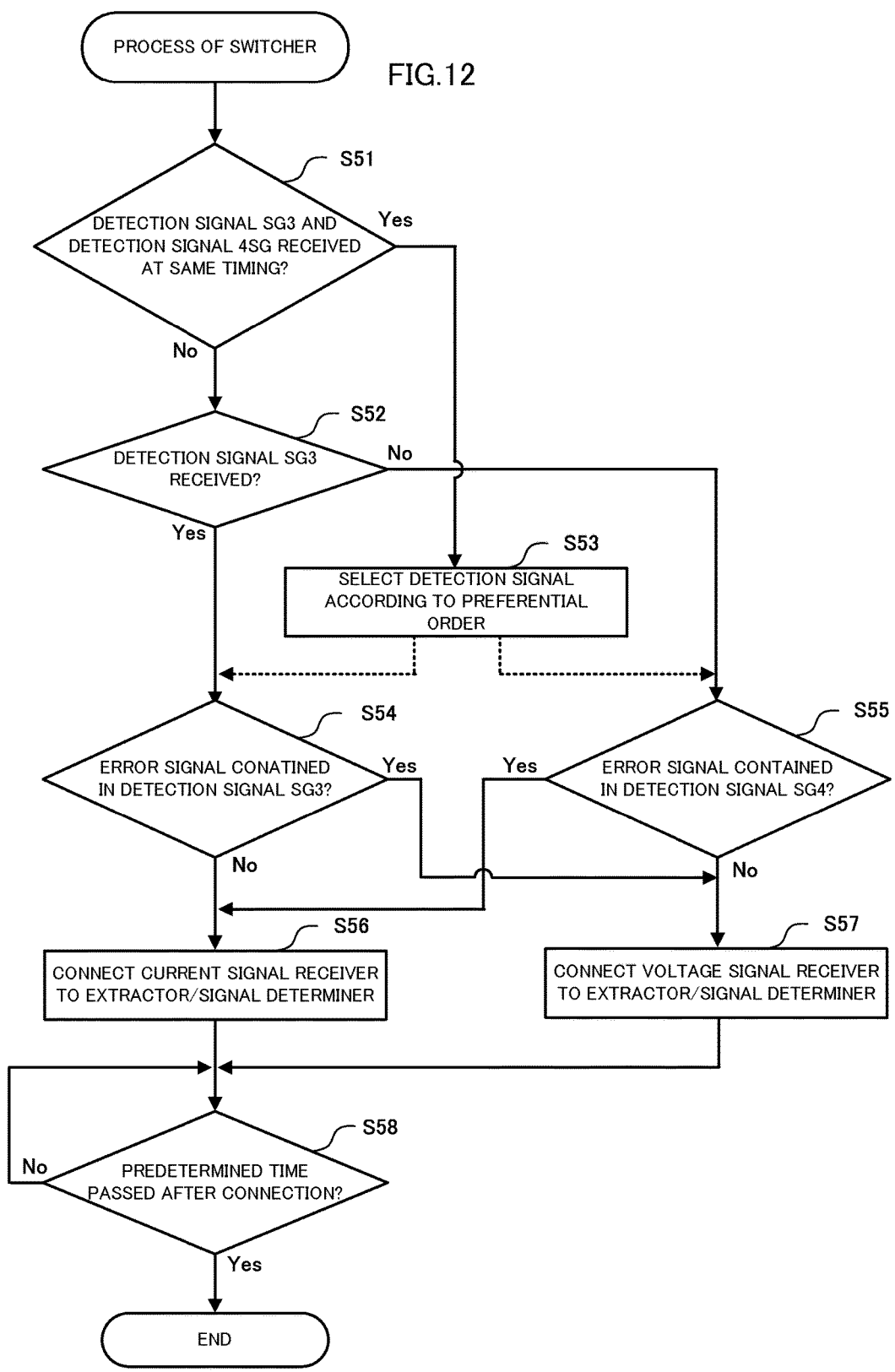
FIG. 12 is a flowchart illustrating a process of a switcher.

When the detection signal SG4 that is output by the converted voltage signal determiner 27 is received through the process explained above, or when the detection signal SG3 that is output by the converted current signal determiner 26 through the process of the converted current signal determiner (see FIG. 9), or when the detection signal SG3 and the detection signal SG4 are received at the same timing, the switcher 28 initiates the process of the switcher illustrated in FIG. 12.

The process of the switcher is initiated by the switcher 28 determining whether or not the detection signal SG3 and the detection signal SG4 are received at the same timing (step S51). When determining that the signals are not received at the same timing (step S51; No), the switcher 28 determines whether or not the detection signal SG3 is received (step S52).

The switcher 28 proceeds the process to step S54 when determining that the detection signal SG3 is received (step S52; Yes). Conversely, when determining that no detection signal SG3 is received (step S52; No), the switcher 28 proceeds the process to step S55 since no detection signal SG4 is received.

When determining in the step S51 that the detection signal SG3 and the detection signal SG4 are received at the same timing (step S51; Yes), the switcher 28 selects, according to the preferential order stored in the memory 28a, either one of the command signal SG5 or the command signal SG6 for a command signal to be transmitted to the extractor/signal determiner 30 (step S53). The switcher 28 proceeds the process to either the step S54 or the step S55 according to this preferential order. Note that in the first embodiment, when the detection signal SG3 and the detection signal SG4 are received at the same timing, the switcher 28 selects the command signal SG5 for a command signal that is to be transmitted to the extractor/signal determiner 30.

In the step S54, the switcher 28 determines whether or not the received detection signal SG3 contains any error signal (step S54). When determining that the received detection signal SG3 contains no error signal (step S54; No), which inferring that the converted current signal SG1 is generated by transmission of a normal current signal over the communication lines L1, the switcher 28 switches over the switch 29 to have the demodulator/waveform shaper 23 (current signal receiver 21) connected to the extractor/signal determiner 30 so as to transmit, to the extractor/signal determiner 30, the command signal SG5 (signal obtained by having the communication signal undergone the demodulation and the waveform shaping) that is output by the demodulator/waveform shaper 23 (step S56). Thereafter, the switcher 28 proceeds the process to step S58.

Conversely, when determining that the received detection signal SG3 contains an error signal (step S54; Yes), which inferring the generation of the converted current signal SG1 by transmission of the current signal over the communication lines L1, however, this converted current signal SG1 indicating an anomalous value, the switcher 28 disconnects a connection between the demodulator/waveform shaper 23 and the extractor/signal determiner 30 to prevent a reception of the current signal indicating an anomaly, since there is possible occurrence of an anomaly and the like in the communication unit (step S57). In other words, when the detection signal SG3 containing an error signal is received in the step S57, the switcher 28 switches over the switch 29 to have the voltage signal receiver 24 (modulator/waveform shaper 25) connected to the extractor/signal determiner 30. Thereafter, the switcher 28 proceeds the process to the step S58.

In the step S55, the switcher 28 determines whether or not an error signal is contained in the received detection signal SG4 (step S55). When determining that the received detection signal SG4 contains no error signal (step S55; No), which inferring the generation of the converted voltage signal SG2 by transmission of a normal voltage signal over the communication lines L2, the switcher 28 switches over the switch 29 to have the demodulator/waveform shaper 25 connected to the extractor/signal determiner 30 so as to transmit, to the extractor/signal determiner 30, the command signal SG6 (signal obtained by having the communication signal undergone the demodulation and the waveform shaping) output by the demodulator/waveform shaper 25 (step S57). Thereafter, the switcher 28 proceeds the process to step S58.

Conversely, when determining that the received detection signal SG4 contains an error signal (step S55; Yes), which inferring the generation of the converted voltage signal SG2 by transmission of the voltage signal over the communication lines L2 but this converted voltage signal SG2 indicating an anomalous value, whereas the switcher 28 disconnects a connection between the demodulator/waveform shaper 25 and the extractor/signal determiner 30 to prevent a reception of the voltage signal indicating an anomaly, since there is a possible occurrence of an anomaly and the like in the communication unit (step S56). In other words, in the step S58, the switcher 28 switches over the switch 29 to have the current signal receiver 21 (demodulator/waveform shaper 23) connected to the extractor/signal determiner 30. Thereafter, the switcher 28 proceeds the process to the step S58.

As discussed above, the switcher 28 prevents a reception of a signal that indicates an anomaly (current signal and voltage signal) by executing the process (step S56) subsequent to the determination "Yes" in the step S55 and the process (step S57) subsequent to the determination "Yes" in the step S54.

After executing the step S56 or the step S57, the switcher 28 determines whether or not a predetermined duration (for example, by a length of 1-bit when the communication scheme is based on a baseband scheme) has elapsed after the switch 29 is switched over (step S58).

When determining that the predetermined duration has not elapsed (step S58; No), the switcher 28 repeats the step S58 until the predetermined duration elapses. Conversely, when determining that the predetermined duration has elapsed (step S58; Yes), the switcher 28 terminates the process of the switcher.

As discussed above, after the switch 29 is switched over, the switcher 28 does not switch over the switch 29 until the predetermined duration elapses. Hence, the switcher 28 prevents the switch 29 from being switched over during the reception of the current signal or the voltage signal. Note that with regard to a determination on whether or not the predetermined duration has elapsed after the switch 29 is switched over, the switcher 28 may be provided with, for example, a timer, and the time that is measured through the timer may be used by the switcher 28.

Figure 13:
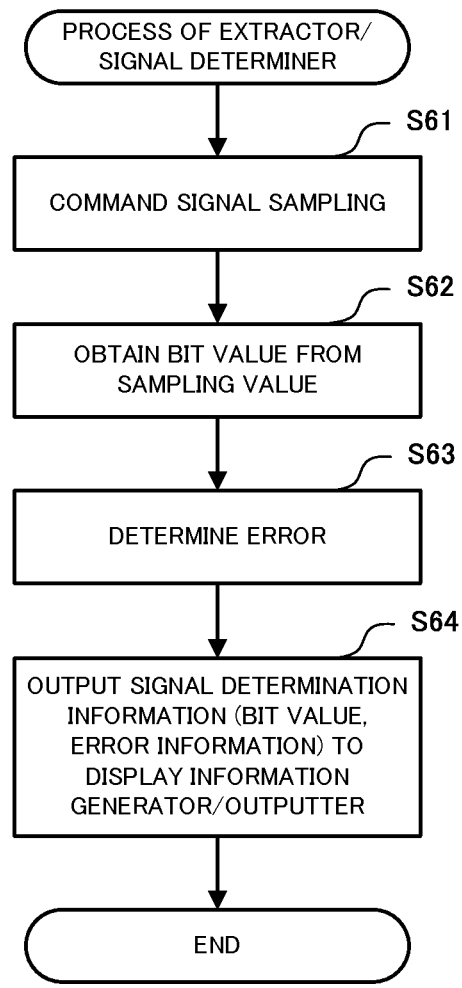
FIG. 13 is a flowchart illustrating a process of an extractor/signal determiner.

Upon receiving either one of the command signal SG5 or the command signal SG6 through the switch-over of the switch 29 by the switcher 28, the extractor/signal determiner 30 initiates the process of the extractor/signal determiner illustrated in FIG. 13.

The process of the extractor/signal determiner is initiated by the sampler 41 of the extractor/signal determiner 30 performing sampling on the received command signal (command signal SG5 or command signal SG6) at predetermined sampling intervals, and outputting the command signal (sampling value) having undergone the sampling (step S61).

After that, when receiving the sampling value, the bit generator 42 obtains a bit value from the received sampling value, and outputs the obtained bit value, that is a bit value (current signal or voltage signal) corresponding to the command signal (step S62).

Thereafter, when receiving a bit value (current signal or voltage signal) corresponding to the command signal, the error determiner 44 executes the process in step S63. That is, the error determiner 44 determines whether or not any error, such as a parity bit error or a framing error, have occurred in the received bit value. When finding any occurrence of error in the bit value corresponding to the command signal, the error determiner 44 generates and outputs error information indicating the details of the error (step S63).

The control interface 43 generates determined-signal information which is a collection of information containing both the bit value corresponding to the command signal that is output by the bit generator 42 in the step S62 and the error information output by the error determiner 44 in the step S63, and the control interface 43 outputs the determined-signal information to the display information generator/outputter 31 (step S64). In a case in which no error information is output by the error determiner 44, the control interface 43 generates determined-signal information represented by a bit value corresponding to a command signal containing no error information.

Note that in the step S64, upon receiving the bit value corresponding to the command signal or the error information, the control interface 43 outputs an interrupt signal to the display information generator/outputter 31. This causes the display information generator/outputter 31 to output a request signal requesting determined-signal information to the control interface 43. In response to this request signal, the control interface 43 outputs the determined-signal information to the display information generator/outputter 31. Accordingly, the display information generator/outputter 31 is capable of receiving the determined-signal information.

Figure 14:
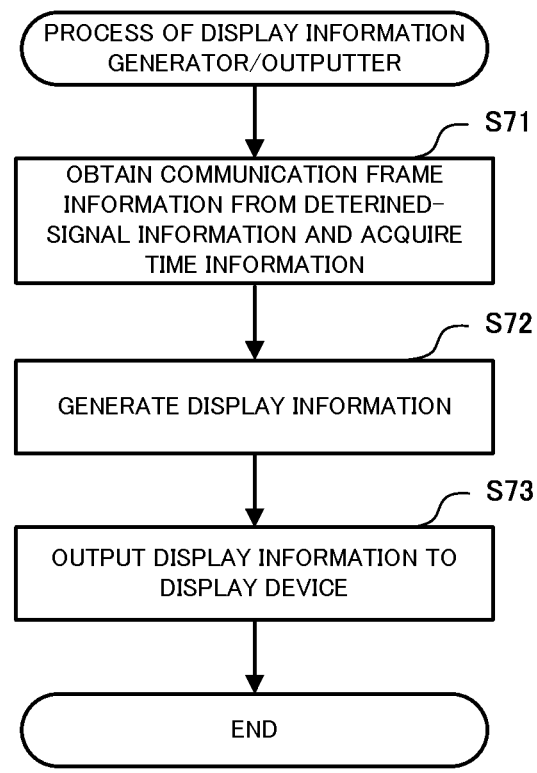
FIG. 14 is a flowchart illustrating a process of a display information generator/outputter.

When receiving the determined-signal information, the display information generator/outputter 31 initiates the process of the display information generator/outputter illustrated in FIG. 14. The process of the display information generator/outputter is initiated by the communication analyzer 52 executing the process in step S71. That is, the communication analyzer 52 obtains communication frame information from the bit value (current signal or voltage signal) corresponding to the command signal contained in the determined-signal information and acquires, from the timer 55, time information indicating the time. The communication analyzer 52 associates the communication frame information with the time information and outputs this associated information. Note that the communication frame information includes, for example, in addition to the current signal or the voltage signal, a sender address of the current signal or that of the voltage signal, a destination address and the like of the current signal or those of the voltage signal.

Subsequently, when receiving the communication frame information and the time information, the display information generator 53 generates display information by converting these pieces of information to the information in a format displayable on the display device 11, and outputs the generated display information to the display interface 54 (step S72).

Thereafter, the display interface 54 outputs, upon receiving the display information, this display information to the display device 11 (step S73).

In this case, when receiving the display information, the display interface 54 outputs an interrupt signal to the display device 11. This causes the display device 11 to output, to the display interface 54, a request signal requesting display information. In response to this request signal, the display interface 54 outputs the display information to the display device 11. Accordingly, the display device 11 is capable of receiving display information.

Figure 15:
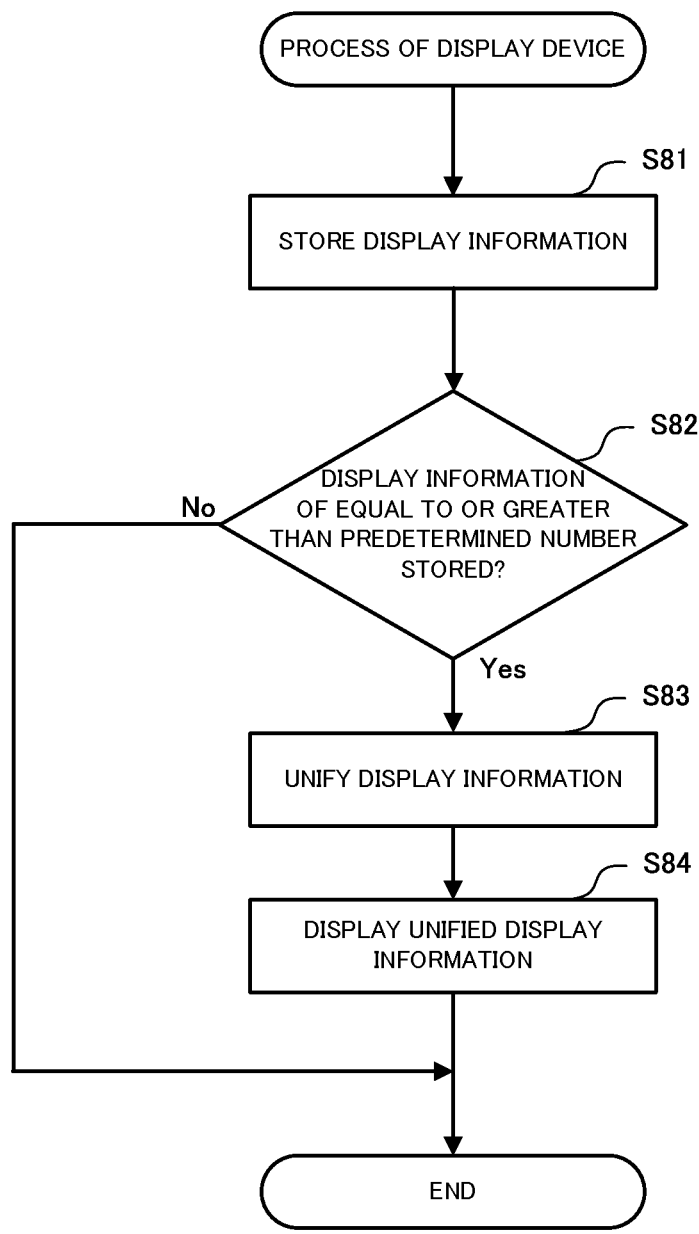
FIG. 15 is a flowchart illustrating a process of a display device.

The display device 11 initiates, upon receiving the display information, the process of the display device illustrated in FIG. 15. The process of the display device is initiated by the display controller 62 storing the received display information in the display information memory 64 (step S81). In a case in which, in the step S81, a plurality of analysis devices 10 is connected to the output interface 61, the display controller 62 associates the received display information with information indicating the sender of the display information (for example, a MAC address) and stores this associated information in the display information memory 64.

Subsequently, the display controller 62 determines whether or not there is stored equal to or greater than necessary number of display information for displaying on a screen in the display information memory 64 (step S82). When determining that the number of display information stored in the display information memory 64 is less than the predetermined number (step S82; No), the display controller 62 terminates the process of the display device because of the insufficient number of display information stored for displaying on the screen. Conversely, when determining that there is equal to or greater than the predetermined number of display information stored in the display information memory 64 (step S82; Yes), the display controller 62 proceeds the process to the step S63.

In the step S63, the display controller 62 reads out each piece of display information stored in the display information memory 64, and associates respective pieces of display information based on the time information contained in the read display information, and puts respective pieces of the display information into a unified format displayable on a single screen. Thereafter, the display controller 62 outputs the unified display information to the display 63 (step S83).

When receiving the unified display information, the display 63 generates a screen from this display information and displays the screen (see, for example, FIG. 6 or FIG. 7) (step S84). Subsequently, the display 63 terminates the process of the display device.

As discussed above, according to the analysis device 10 of the first embodiment, the switcher 28 transmits, to the extractor/signal determiner 30, the converted current signal SG1 generated by the current-voltage converter 22 when the converted current signal determiner 26 determines that the converted current signal SG1 has been generated by transmission of the current signal over the communication lines L1; in the meantime, the switcher 28 performs the switch-over so as not to transmit the converted voltage signal SG2 generated by the voltage sensor 14 to the extractor/signal determiner 30. In addition, when the converted voltage signal determiner 27 determines that the converted voltage signal SG2 has been generated by transmission of a voltage signal over the communication lines L2, the switcher 28 transmits the converted voltage signal SG2 generated by the voltage sensor 14 to the extractor/signal determiner 30; in the meantime, performs the switch-over so as not to transmit the converted current signal SG1 generated by the current-voltage converter 22 to the extractor/signal determiner 30. That is, according to the analysis device 10, a signal sender device that sends signals necessary to generate display information is automatically switched over between the current signal receiver 21 and the voltage signal receiver 24. Hence, according to the analysis device 10, even though a current signal is exchanged via the one communication lines L1 and a voltage signal is exchanged via the other communication lines L2, display information can be generated by receiving either signal through the automatic switch over of the signal sender. In this way, the extractor/signal determiner 30 and the display information generator/outputter 31, both of which employing a function of generating display information based on either one of the received current signal or the received voltage signal and of outputting the display information to the display device 11, are made shareable to both the current signal operation and the voltage signal operation. Thus, according to the analysis device 10 of the first embodiment, there is no duplicate use of a function of generating display information and of outputting the generated display information.

Further, according to the analysis device 10, for example, with only the communication lines L1 being provided (no communication lines L2 are provided), whichever signal is exchanged via the communication lines L1, either a current signal or a voltage signal, as long as the current sensor 13 and the voltage sensor 14 are arranged over the communication lines L1, a signal transmitted over the communication lines L1 can be received without developing any reception errors caused by incorrect arrangement of sensors.

Still further, according to the analysis device 10, display information displayable on the display device 11 is generated based on either one of the received current signal or the received voltage signal, and is output to the display device 11. Therefore, according to the analysis device 10, the user having watched the display screen on the display device 11 can analyze the command exchange status (see FIG. 6), the signal waveforms (see FIG. 7) and the like.

Second Embodiment

Next, an analysis device 10 according to the second embodiment of the present disclosure will be described with reference to FIG. 16 and FIG. 17. The analysis device 10 of the second embodiment is the same as the analysis device 10 of the first embodiment having modified part of the processes; more specifically, there are modifications to the process executed by the converted current signal determiner 26 and the process executed by the converted voltage signal determiner 27. The remaining processes and configurations of the analysis device 10 of the second embodiment are identical to those of the analysis device 10 of the first embodiment. Thus, as for the analysis device 10 of the second embodiment, the same configurations and processes as those of the analysis device 10 of the first embodiment will be denoted by the same reference numbers, and the discussion thereof will be omitted.

Note that the analysis device 10 of the second embodiment determines whether or not a frequency of the converted current signal SG1 generated by the current-voltage converter 22 meets a condition, thereby determining whether or not the converted current signal SG1 has been generated by transmission of a current signal over the communication lines L1. In addition, the analysis device 10 of the second embodiment determines whether or not a frequency of the converted voltage signal SG2 generated by the voltage sensor 14 meets a condition, thereby determining whether or not the converted voltage signal SG2 has been generated by transmission of a voltage signal over the communication lines L2. Hence, the analysis device 10 of the second embodiment is applied to a case in which a frequency modulation technique that is a signal transmission technique utilized in exchanging signals among communication units. On this account, it is presumed that a signal transmission technique is the frequency modulation technique in the following description.

Figure 16:
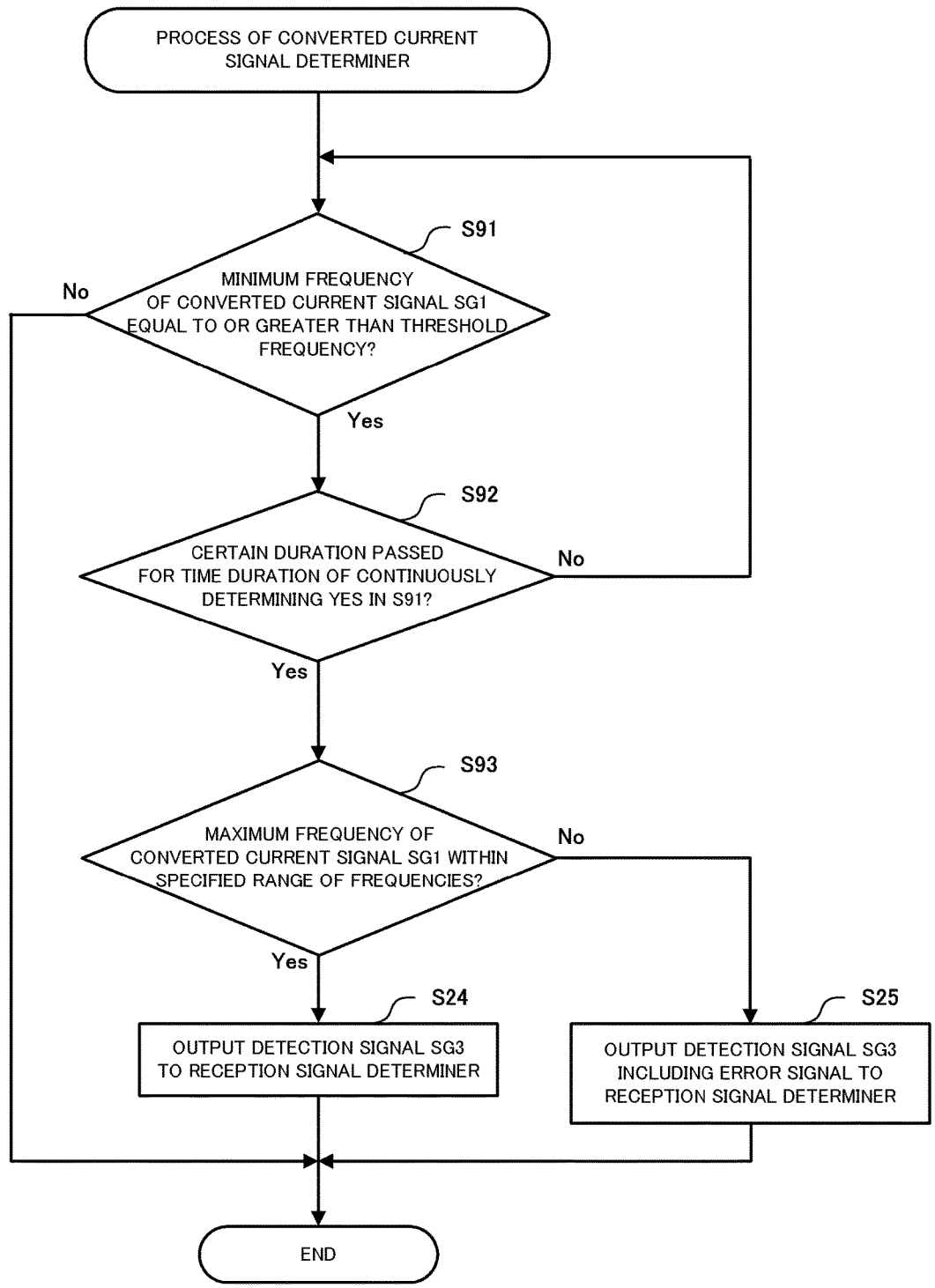
FIG. 16 is a flowchart illustrating a process of a converted current signal determiner of an analysis device according to a second embodiment.

After executing the process of the current signal receiver (see FIG. 8) by the current signal receiver 21 in the analysis device 10 of the second embodiment, the converted current signal SG1 is generated by the current-voltage converter 22 of the current signal receiver 21, and when this converted current signal SG1 is received by the converted current signal determiner 26, the converted current signal determiner 26 initiates the process of the converted current signal determiner illustrated in FIG. 16.

The converted current signal determiner 26 firstly determines whether or not the minimum frequency of the converted current signal SG1 that is generated by the current-voltage converter 22 is equal to or greater than a preset threshold frequency (step S91). Note that the frequency of the converted current signal SG1 can be obtained as follow. That is, the converted current signal determiner 26 may acquire, for example, several dozen points of time intervals among peak values (for example, maximum values) in the converted current signal SG1, obtain a wavelength of the converted current signal SG1 based on these acquired time intervals, and obtain the minimum frequency of the converted current signal SG1 from this wavelength. In this case, the preset threshold frequency is determined beforehand based on a modulation width (shift width) of the converted current signal SG1.

When determining that the minimum frequency of the converted current signal SG1 is smaller than the threshold frequency (step S91; No), the converted current signal determiner 26 terminates the process because of the detection of noises and the like.

Conversely, when determining that the minimum frequency of the converted current signal SG1 is equal to or greater than the threshold frequency (step S91; Yes), the converted current signal determiner 26 determines whether or not the same determined results are continuously drawn over a certain duration of time, thereby determining whether or not a signal length of the converted current signal SG1 has the certain duration of time (step S92). When the time duration for continuously determining "Yes" in S91 does not exceed the certain duration (step S92; No), the converted current signal determiner 26 returns the process to the step S91. According to the determinations in the step S92 and the step S91, when the signal length of the converted current signal SG1 is shorter than the certain duration even though the minimum frequency of the converted current signal SG1 is equal to or greater than the threshold frequency, the converted current signal determiner 26 eventually determines "No" in the step S91. Hence, as for the converted current signal SG1 having the signal length shorter than the certain duration, which is handled by the converted current signal determiner 26 in similar manner as the detection of noises and the like.

When determining in the step S92 that the time duration for continuously determining "Yes" in S91 exceeds the certain duration (step S92; No), the converted current signal determiner 26 determines whether or not the maximum frequency of the converted current signal SG1 is within a specified range of frequencies (step S93). In this case, the specified range of frequencies is set in advance based on a modulation width (shifting width) of the converted current signal SG1. The maximum frequency of the converted current signal SG1 can be obtained from a wavelength of the converted current signal SG1 that is obtained based on time intervals among peak values (for example, the maximum values) of the converted current signal SG1.

When determining that the maximum frequency of the converted current signal SG1 is within the specified range of frequencies (step S93; Yes), the converted current signal determiner 26 outputs, to the switcher 28, the detection signal SG3 indicating that the converted current signal SG1 has been generated by transmission of the current signal over the communication lines L1, and terminates the process (step S24).

Accordingly, the converted current signal determiner 26 determines whether or not the converted current signal SG1 is generated by transmission of the current signal over the communication lines L1 based on the preset threshold frequency and signal length, thereby preventing a false output of the detection signal SG3 when noises and the like are detected.

Conversely, when determining that the maximum frequency of the converted current signal SG1 is not within the specified range of frequencies (step S93; No), which indicating that the maximum frequency of the converted current signal SG1 is beyond the specified range of frequencies even though the minimum frequency of the converted current signal SG1 is equal to or greater than the preset threshold frequency and that the signal length of the converted current signal SG1 has the certain duration, thus the converted current signal determiner 26 outputs, to the switcher 28, the detection signal SG3 including an error signal, and terminates the process (step S25).

Figure 17:
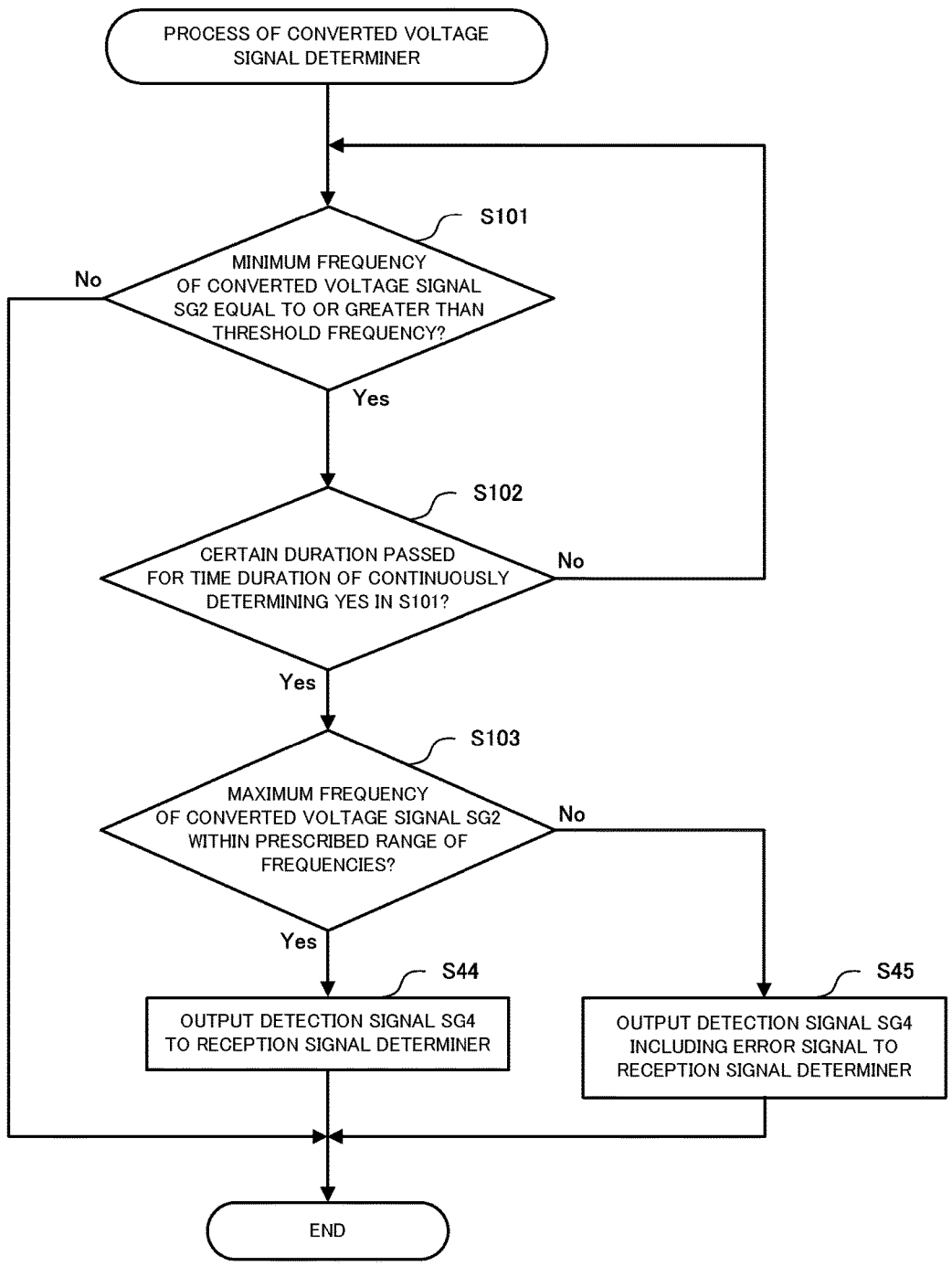
FIG. 17 is a flowchart illustrating a process of a converted voltage signal determiner of the analysis device according to the second embodiment.

In addition, when the voltage signal receiver 24 of the analysis device 10 of the second embodiment executes the process of the voltage signal receiver (see FIG. 10), the converted voltage signal SG2 is output by the voltage signal receiver 24, and this converted voltage signal SG2 is received by the converted voltage signal determiner 27, and the converted voltage signal determiner 27 initiates the process of the converted voltage signal determiner illustrated in FIG. 17.

The converted voltage signal determiner 27 firstly determines whether or not the minimum frequency of the converted voltage signal SG2 that is output by the voltage signal receiver 24 is equal to or greater than a predetermined threshold frequency (step S101). Note that a frequency of the converted voltage signal SG2 can be obtained as follow. That is, the converted voltage signal determiner 27 may acquire, for example, several dozen points of time intervals among peak values (for example, the maximum values) in the converted voltage signal SG2, obtain a wavelength of the converted voltage signal SG2 based on these acquired time intervals, and, from this wavelength, obtain the minimum frequency of the converted voltage signal SG2. In this case, the predetermined threshold frequency is set in advance based on a modulation width (shift width) of the converted voltage signal SG2.

When determining that the minimum frequency of the converted voltage signal SG2 is smaller than the predetermined threshold frequency (step S101; No), the converted voltage signal determiner 27 terminates this process because it is a detection of noises and the like.

Conversely, when determining that the minimum frequency of the converted voltage signal SG2 is equal to or greater than the predetermined threshold frequency (step S101; Yes), the converted voltage signal determiner 27 determines whether or not a duration of time for continuously drawing the same determined results exceeds a certain duration, thereby determining whether or not the signal length of the converted voltage signal SG2 has the certain duration (step S102). When determining that the duration of time for continuously determining "Yes" in S101 does not exceed the certain duration (step S102; No), the converted voltage signal determiner 27 returns the process to the step S101. Based on the determinations in the step S102 and the step S101, when the signal length of the converted voltage signal SG2 is shorter than the certain duration even though the minimum frequency of the converted voltage signal SG2 is equal to or greater than the predetermined threshold frequency, the converted voltage signal determiner 27 eventually determines "No" in the step S101. Hence, as for the converted voltage signal SG2 having a signal length shorter than the certain duration, the converted voltage signal determiner 27 handles such a signal in similar manner as the detection of noises and the like.

When determining in the step S102 that the duration of time for continuously determining "Yes" in S101 exceeds the certain duration (step S102; No), the converted voltage signal determiner 27 determines whether or not the maximum frequency of the converted voltage signal SG2 is within the prescribed range of frequencies (step S103). In this case, the prescribed range of frequencies is set in advance based on the modulation width (shift width) of the converted voltage signal SG2. The maximum frequency of the converted voltage signal SG2 is obtainable from a wavelength that is obtained based on the time intervals among peak values (for example, the minimum values) of the converted voltage signal SG2.

When determining that the maximum frequency of the converted voltage signal SG2 is within the prescribed range of frequencies (step S103; Yes), the converted voltage signal determiner 27 outputs, to the switcher 28, the detection signal SG4 indicating that the converted voltage signal SG2 has been generated by transmission of the voltage signal over the communication lines L2, and terminates this process (step S44).

In this way, the converted voltage signal determiner 27 determines whether or not the converted voltage signal SG2 has been generated by transmission of the voltage signal over the communication lines L2 based on the predetermined threshold frequency and signal length, thereby preventing a false output of a detection signal SG4 when noises and the like are detected.

Conversely, when determining that the maximum frequency of the converted voltage signal SG2 is not within the prescribed range of frequencies (step S103; No), which inferring that the maximum frequency of the converted voltage signal SG2 exceeds the prescribed range of frequencies even though the minimum frequency of the converted voltage signal SG2 is equal to or greater than the predetermined threshold frequency and that the signal length of the converted voltage signal SG2 has the certain duration, whereas the converted voltage signal SG2 indicates an anomalous value; therefore, the converted voltage signal determiner 27 outputs, to the switcher 28, the detection signal SG4 including an error signal and terminates this process (step S45).

As discussed above, according to the analysis device 10 of the second embodiment, the signal sender device that sends signals necessary to generate display information is automatically switched over between the current signal receiver 21 and the voltage signal receiver 24 by determining whether or not the frequency of the converted current signal SG1 generated by the current-voltage converter 22 meets the preset threshold frequency and the specified range of frequencies, and by determining whether or not a frequency of the converted voltage signal SG2 generated by the voltage sensor 14 meets the predetermined threshold frequency and the prescribed range of frequencies. Accordingly, the analysis device 10 of the second embodiment enables a generation of display information even when a frequency modulation technique is applied for a signal transmission technique to exchange signals among communication units.

Further, according to the analysis device 10 of the second embodiment, like the analysis device 10 of the first embodiment, when the converted current signal determiner 26 determines that the converted current signal SG1 is generated by transmission of the current signal over the communication lines L1, the switcher 28 transmits, to the extractor/signal determiner 30, the converted current signal SG1 that is generated by the current-voltage converter 22, in the meantime, performs a switch-over so as not to transmit, to the extractor/signal determiner 30, the converted voltage signal SG2 that is generated by the voltage sensor 14. In addition, when the converted voltage signal determiner 27 determines that the converted voltage signal SG2 is generated by transmission of the voltage signal over the communication lines L2, the switcher 28 transmits, to the extractor/signal determiner 30, the converted voltage signal SG2 generated by the voltage sensor 14, in the meantime, performs a switch-over so as not to transmit the converted current signal SG1 generated by current-voltage converter 22 to the extractor/signal determiner 30. In this way, the extractor/signal determiner 30 and the display information generator/outputter 31, both of which employing a function of generating display information based on either one of the received current signal or the received voltage signal and of outputting the display information to the display device 11, are made shareable to both the current signal operation and the voltage signal operation. Thus, according to the analysis device 10 of the second embodiment, there is no duplicate use of a function of generating display information and of outputting the generated display information.

Still further, according to the analysis device 10 of the second embodiment, like the analysis device 10 of the first embodiment, for example, with only the communication lines L1 being provided (no communication lines L2 are provided), whichever signal is exchanged via the communication lines L1, either a current signal or a voltage signal, as long as the current sensor 13 and the voltage sensor 14 are arranged over the communication lines L1, a signal transmitted over the communication lines L1 can be received without developing any reception errors caused by incorrect arrangement of sensors.

Still further, according to the analysis device 10 of the second embodiment, like the analysis device 10 of the first embodiment, display information displayable on the display device 11 is generated based on either one of the received current signal or the received voltage signal, and is output to the display device 11. Therefore, according to the analysis device 10, the user having watched the display screen on the display device 11 can analyze the command exchange status (see FIG. 6), the signal waveforms (see FIG. 7) and the like.

The embodiments of the present disclosure have been explained above, however, the present disclosure is not limited to the above-described embodiments and various modifications and applications are possible.

For example, the analysis device 10 of the first embodiment performs the automatic switch-over of the sender that sends signals necessary to generate display information based on determinations on whether or not the converted current signal SG1 of the current-voltage converter 22 meets a preset threshold value and specified range of values, and whether or not the voltage value of the converted voltage signal SG2 generated by the voltage sensor 14 meets predetermined threshold value and prescribed range of values. In addition, the analysis device 10 of the second embodiment performs the automatic switch-over of the sender that sends signals necessary to generate display information based on determinations on whether or not a frequency of the converted current signal SG1 generated by the current-voltage converter 22 meets a preset threshold frequency and a specified range of frequencies and whether or not a frequency of the converted voltage signal SG2 generated by the voltage sensor 14 meets a predetermined threshold frequency and a prescribed range of frequencies. However, the present disclosure is not limited to these cases, and the analysis device 10 may be configured to perform both determination on the voltage value and determination on the frequency, thereby performing the automatic switch-over of the sender that sends signals essential to generate display information.

According to such a configuration, the converted current signal determiner 26 can execute the following process. That is, by initially executing the process in the step S21 (see FIG. 9) and determining "Yes" in the step S21, the converted current signal determiner 26 executes the process in the step S91 (see FIG. 16). When determining "Yes" in the step S91, the converted current signal determiner 26 executes the process in the step S22 (see FIG. 9). After that, when determining "No" in the step S22, the converted current signal determiner 26 returns the process to the step S21, and when determining "Yes" in the step S22, executes the process in the step S23. Subsequently, when determining "Yes" in the step S23, the converted current signal determiner 26 executes the process in the step S24, and when determining "No" in the step S23, executes the process in the step S25. After that, the converted current signal determiner 26 terminates the process. Note that the converted current signal determiner 26 also terminates the process when determining "No" in the step S21 and when determining "No" in the step S91 (see FIG. 16). According to the configuration described above, this process can be executed by the converted current signal determiner 26.

In addition, according to the configuration described above, the converted voltage signal determiner 27 can execute the process as follow. That is, by initially executing the process in the step S41 (see FIG. 11) and determining "Yes" in the step S41, the converted voltage signal determiner 27 executes the process in the step S101 (see FIG. 17). When determining "Yes" in the step S101, the converted voltage signal determiner 27 executes the process in the step S42 (see FIG. 11). After that, when determining "No" in the step S42, the converted voltage signal determiner 27 returns the process to the step S41, and when determining "Yes" in the step S42 executes the process in the step S43. Subsequently, when determining "Yes" in the step S43, the converted voltage signal determiner 27 executes the process in the step S44, and when determining "No" in the step S43, executes the process in the step S45. After that, the converted voltage signal determiner 27 terminates the process. Note that the converted voltage signal determiner 27 also terminates the process when determining "No" in the step S41 and when determining "No" in the step S101 (see FIG. 17). According to the configuration described above, this process can be executed by the converted voltage signal determiner 27.

The analysis device 10 of the first embodiment is provided with the demodulator/waveform shaper 23, 25 in front of the switch 29, but the present disclosure is not limited to this structure. The demodulator/waveform shaper 23, 25 may be provided behind the switch 29, more specifically, between the switch 29 and the extractor/signal determiner 30. According to this configuration, the demodulator/waveform shaper can be made shareable to both current signal operation and voltage signal operation.

Although the analysis device 10 of the first embodiment includes the demodulator/waveform shaper 23, 25, which is not necessary when no demodulation is performed on the current signal and the voltage signal. In this case, a configuration may be employed in which the demodulator/waveform shaper 23, 25 are removed from the analysis device 10 of the first embodiment, the output terminal of the current-voltage converter 22 is connected to one end of the switch terminal of the switch 29, and the output terminal of the voltage sensor 14 is connected to the other end of the switch terminal of the switch 29.

In each of the aforementioned embodiments, the analysis device 10 (the analysis device 10-1 and the analysis device 10-2) and the display device 11 may perform cable communication or wireless communication.

Note that in each of the embodiments described above, a program for controlling the analysis device 10 may be distributed in a manner stored in a computer readable recording medium, such as a flexible disc, a compact disc read-only memory (CD-ROM), a digital versatile disc (DVD), and a magneto-optical (MO) disc, and installed on a computer and the like, to realize the analysis device that executes the processes illustrated in FIG. 8 to FIG. 17.

The program described above can be stored, for the meantime, on a disc device and the like of a predetermined server device over communication network like the Internet, and superimposed, for example, on carrier waves so as to make the program downloadable and so forth.

When each operating system (OS) shares in the processes illustrated in FIG. 8 to FIG. 17 described above in order to accomplish these processes, or when the processes are accomplished by the OS and an application working in synergy and so forth, only the portions other than the OS may be stored on a medium and distributed, or made downloadable and so forth.

Various embodiments and modifications can be made in the present disclosure without departing from the spirit and the broad scope thereof. The embodiments described above are intended for purposes of illustration only and are not intended to limit the scope of the present disclosure in any way. Therefore, the scope of the present disclosure is defined by the appended claims rather than the embodiments described above. Further, various modifications made within the scope of the claims and within the same purposes thereof should be included within the scope of the present disclosure.

The invention claimed is:
1. An analysis device comprising:
a current sensor detecting a current that flows through a first communication line over which a current signal is transmitted;
a converted current signal generator that converts the current detected by the current sensor to a voltage and generates a converted current signal indicating a voltage value that corresponds to magnitude of the current flowing through the first communication line;
a converted current signal determiner that determines, when the converted current signal meets a preset condition, that the converted current signal is generated by a transmission of the current signal over the first communication line;
a voltage sensor that detects a voltage applied across a second communication line over which a voltage signal is transmitted, the second communication line being different from the first communication line, and generates a converted voltage signal indicating a voltage value that corresponds to magnitude of the detected voltage;
a converted voltage signal determiner that determines, when the converted voltage signal meets a preset condition, that the converted voltage signal is generated by a transmission of the voltage signal over the second communication line;
a display information generator that generates display information from either one of the converted current signal and the converted voltage signal;
an outputter that outputs the generated display information to a display device on which the display information is displayable; and
a switcher that performs, when the converted current signal is determined to be generated by the transmission of the current signal over the first communication line, a switch-over so as to transmit the converted current signal to the display information generator, and simultaneously so as not to transmit the converted voltage signal to the display information generator, and that performs, when the converted voltage signal is determined to be generated by the transmission of the voltage signal over the second communication line, a switch-over so as to transmit the converted voltage signal to the display information generator, and simul- taneously so as not to transmit the converted current signal to the display information generator.

2. The analysis device according to claim 1, wherein:
the converted current signal determiner comprises:
   a threshold current determiner that determines whether or not the voltage value indicated by the converted current signal is equal to or greater than a first threshold value; and
   a current-flow duration determiner that determines whether or not a time duration over which the threshold current determiner continues to determine that the voltage value indicated by the converted current signal is equal to or greater than the first threshold value has passed a first time duration;
when the time duration over which the threshold current determiner continues to determine that the voltage value indicated by the converted current signal is equal to or greater than the first threshold value is determined to have passed the first time duration, the converted current signal determiner determines that the converted current signal is generated by the transmission of the current signal over the first communication line; and
the converted voltage signal determiner comprises:
   a threshold voltage determiner that determines whether or not the voltage value indicated by the converted voltage signal is equal to or greater than a second threshold value; and
   a voltage duration determiner that determines whether or not a time duration over which the threshold voltage determiner continues to determine that the voltage value indicated by the converted voltage signal is equal to or greater than the second threshold value has passed a second time duration; and
when the time duration, over which the threshold voltage determiner continues to determine that the voltage value indicated by the converted voltage signal is equal to or greater than the second threshold value, is determined to have passed the second time duration, the converted voltage signal determiner determines that the converted voltage signal is generated by the transmission of the voltage signal over the second communication line.

3. The analysis device according to claim 2, wherein:
the converted current signal determiner further comprises:
   a current range determiner that determines whether or not the voltage value indicated by the converted current signal is within a specified range when the time duration over which the threshold current determiner continues to determine that the voltage value indicated by the converted current signal is equal to or greater than the first threshold value is determined to have passed the first time duration;
when the voltage value indicated by the converted current signal is determined to be within the specified range, the converted current signal determiner determines that the converted current signal is generated by the transmission of the current signal over the first communication line, and when the voltage value indicated by the converted current signal is determined not to be within the specified range, the converted current signal determiner determines that the converted current signal indicates an anomaly;
the converted voltage signal determiner further comprises:
   a voltage range determiner that determines whether or not the voltage value indicated by the converted voltage signal is within a prescribed range when the time duration over which the threshold voltage determiner continues to determine that the voltage value indicated by the converted voltage signal is equal to or greater than the second threshold value is determined to have passed the second time duration;
when the voltage value indicated by the converted voltage signal is determined to be within the prescribed range, the converted voltage signal determiner determines that the converted voltage signal is generated by the transmission of the voltage signal over the second communication line, and when the voltage value indicated by the converted voltage signal is determined not to be within the prescribed range, the converted voltage signal determiner determines that the converted voltage signal indicates an anomaly; and
the switcher performs, when the converted current signal is determined to indicate the anomaly, the switch-over so as not to transmit the converted current signal to the display information generator, and simultaneously so as to transmit the converted voltage signal to the display information generator, and the switcher performs, when the converted voltage signal is determined to indicate the anomaly, the switch-over so as not to transmit the converted voltage signal to the display information generator, and simultaneously so as to transmit the converted current signal to the display information generator.

4. The analysis device according to claim 1, wherein:
the converted current signal determiner comprises:
   a current frequency determiner that determines whether or not a frequency indicated by the converted current signal is equal to or greater than a first threshold frequency;
when the frequency of the converted current signal is determined by the current frequency determiner to be equal to or greater than the first threshold frequency, the converted current signal determiner determines that the converted current signal is generated by the transmission of the current signal over the first communication line; and
the converted voltage signal determiner comprises:
   a voltage frequency determiner that determines whether or not a frequency indicated by the converted voltage signal is equal to or greater than a second threshold frequency; and
when the frequency indicated by the converted voltage signal is determined by the voltage frequency determiner to be equal to or greater than the second threshold frequency, the converted voltage signal determiner determines that the converted voltage signal is generated by the transmission of the voltage signal over the second communication line.

5. The analysis device according to claim 4, wherein:
the converted current signal determiner further comprises:
   a current frequency range determiner that determines whether or not the frequency indicated by the converted current signal is within a specified range of frequencies when the frequency indicated by the converted current signal is determined to be equal to or greater than the first threshold frequency;
when the frequency indicated by the converted current signal is determined by the current frequency range determiner to be within the specified range of frequencies, the converted current signal determiner determines that the converted current signal is generated by the transmission of the current signal over the first communication line, and when the frequency indicated by the converted current signal is determined not to be within the specified range of frequencies, the converted current signal determiner determines that the converted current signal-indicates an anomaly;

the converted voltage signal determiner further comprises:
- a voltage frequency range determiner that determines whether or not the frequency indicated by the converted voltage signal is within a prescribed range of frequencies when the frequency indicated by the converted voltage signal is determined to be equal to or greater than the second threshold frequency;

when the frequency indicated by the converted voltage signal is determined by the voltage frequency range determiner to be within the prescribed range of frequencies, the converted voltage signal determiner determines that the converted voltage signal is generated by the transmission of the voltage signal over the second communication line, and when the frequency indicated by the converted voltage signal is determined not to be within the prescribed range of frequencies, the converted voltage signal determiner determines that the converted voltage signal indicates an anomaly;

the switcher performs, when the converted current signal is determined to indicate the anomaly, the switch-over so as not to transmit the converted current signal to the display information generator, and simultaneously so as to transmit the converted voltage signal to the display information generator, and the switcher performs, when the converted voltage signal is determined to indicate the anomaly, the switch-over so as not to transmit the converted voltage signal to the display information generator, and simultaneously so as to transmit the converted current signal to the display information generator.

6. The analysis device according to claim 1, wherein:
the switcher:
- comprises a memory that stores a preferential order indicating whether to preferentially transmit the converted current signal to the display information generator, and whether to preferentially transmit the converted voltage signal to the display information generator; and
- performs the switch-over according to the preferential order stored in the memory when a timing for the converted current signal determiner to determine that the converted current signal is generated by the transmission of the current signal over the first communication line coincides with a timing for the converted voltage signal determiner to determine that the converted voltage signal is generated by the transmission of the voltage signal over the second communication line.

7. The analysis device according to claim 1, wherein the switcher comprises a switch-over preventer that prevents an additional switch-over until a preset time passes after the previous switch-over is performed.

8. The analysis device according to claim 1, further comprising:
the display device,
wherein the display device unifies respective pieces of the display information that are output by the outputter into a format displayable on a single screen, and displays the unified display information.

9. The analysis device according to claim 8, wherein the display device unifies, in association with each other, the respective pieces of the display information based on time information contained in the display information that is output by the outputter, the time information representing a time at which the display information is generated, and displays the unified display information.

10. An analysis method comprising:
- a current detection step of detecting a current that flows through a first communication line over which a current signal is transmitted;
- a converted current signal generating step of converting the detected current to a voltage and generating a converted current signal indicating a voltage value that corresponds to magnitude of the current flowing through the first communication line;
- a converted current signal determining step of determining that the converted current signal is generated by a transmission of the current signal over the first communication line when the converted current signal meets a preset condition;
- a converted voltage signal generating step of detecting a voltage applied across a second communication line over which a voltage signal is transmitted, the second communication line being different from the first communication line, and generating a converted voltage signal indicating a voltage value that corresponds to magnitude of the detected voltage;
- a converted voltage signal determining step of determining that the converted voltage signal is generated by a transmission of the voltage signal over the second communication line when the converted voltage signal meets a preset condition;
- a switch-over step of performing, when the converted current signal is determined to be generated by the transmission of the current signal over the first communication line, a switch-over so as to transmit the converted current signal, and simultaneously so as not to transmit the converted voltage signal, and of performing, when the converted voltage signal is determined to be generated by the transmission of the voltage signal over the second communication line, a switch-over so as to transmit the converted voltage signal and simultaneously so as not to transmit the converted current signal;
- a display information generating step of generating display information from either one of the converted current signal and the converted voltage signal transmitted through the switch-over step; and
- an outputting step of outputting the generated display information to a display device on which the display information is displayable.

11. The analysis method according to claim 10, wherein:
the converted current signal determining step comprises:
- a threshold current determining step of determining whether or not the voltage value indicated by the converted current signal is equal to or greater than a first threshold value; and
- a current-flow duration determining step of determining whether or not a time duration over which in the threshold current determining step the voltage value indicated by the converted current signal continues to be determined to be equal to or greater than the first threshold value has passed a first time duration;

when the time duration, over which in the threshold current determining step the voltage value indicated by the converted current signal continues to be determined to be equal to or greater than the first threshold value, is determined to have passed the first time duration, in the converted current signal determining step the converted current signal is determined to be generated by the transmission of the current signal over the first communication line; and the converted voltage signal determining step comprises:
- a threshold voltage determining step of determining whether or not the voltage value indicated by the converted voltage signal is equal to or greater than a second threshold value; and
- a voltage duration determining step of determining whether or not a time duration over which in the threshold voltage determining step the voltage value indicated by the converted voltage signal continues to be determined to be equal to or greater than the second threshold value has passed a second time duration; and when the time duration, over which in the threshold voltage determining step the voltage value indicated by the converted voltage signal continues to be determined to be equal to or greater than the second threshold value, is determined to have passed the second time duration, in the converted voltage signal determining step the converted voltage signal is determined to be generated by the transmission of the voltage signal over the second communication line.

12. The analysis method according to claim 11, wherein:
the converted current signal determining step further comprises:
- a current range determining step of determining whether or not the voltage value indicated by the converted current signal is within a specified range when the time duration over which in the threshold current determining step the voltage value indicated by the converted current signal continues to be determined to be equal to or greater than the first threshold value, is determined to have passed the first time duration;

when the voltage value indicated by the converted current signal is determined to be within the specified range, in the converted current signal determining step the converted current signal is determined to be generated by the transmission of the current signal over the first communication line, and when the voltage value indicated by the converted current signal is determined not to be within the specified range, in the converted current signal determining step the converted current signal is determined to indicate an anomaly;

the converted voltage signal determining step further comprises:
- a voltage range determining step of determining whether or not the voltage value indicated by the converted voltage signal is within a prescribed range when the time duration over which in the threshold voltage determining step the voltage value indicated by the converted voltage signal continues to be determined to be equal to or greater than the second threshold value is determined to have passed the second time duration;

when the voltage value indicated by the converted voltage signal is determined to be within the prescribed range, in the converted voltage signal determining step the converted voltage signal is determined to be generated by the transmission of the voltage signal over the second communication line, and when the voltage value indicated by the converted voltage signal is determined not to be within the prescribed range, in the converted voltage signal determining step the converted voltage signal is determined to indicate an anomaly; and in the switch-over step, when the converted current signal is determined to indicate the anomaly, the switch-over so as not to transmit the converted current signal, and simultaneously so as to transmit the converted voltage signal is performed, and when the converted voltage signal is determined to indicate the anomaly, the switch-over so as not to transmit the converted voltage signal, and simultaneously so as to transmit the converted current signal is performed.

13. The analysis method according to claim 10, wherein:
the converted current signal determining step comprises:
- a current frequency determining step of determining whether or not a frequency indicated by the converted current signal is equal to or greater than a first threshold frequency;

when the frequency of the converted current signal is determined in the current frequency determining step to be equal to or greater than the first threshold frequency, in the converted current signal determining step the converted current signal is determined to be generated by the transmission of the current signal over the first communication line; and the converted voltage signal determining step comprises:
- a voltage frequency determining step of determining whether or not a frequency indicated by the converted voltage signal is equal to or greater than a second threshold frequency; and when the frequency indicated by the converted voltage signal is determined in the voltage frequency determining step to be equal to or greater than the second threshold frequency, in the converted voltage signal determining step the converted voltage signal is determined to be generated by the transmission of the voltage signal over the second communication line.

14. The analysis method according to claim 13, wherein:
the converted current signal determining step further comprises:
- a current frequency range determining step of determining whether or not the frequency indicated by the converted current signal is within a specified range of frequencies when the frequency indicated by the converted current signal is determined to be equal to or greater than the first threshold frequency;

when the frequency indicated by the converted current signal is determined in the current frequency range determining step to be within the specified range of frequencies, in the converted current signal determining step the converted current signal is determined to be generated by the transmission of the current signal over the first communication line, and when the frequency indicated by the converted current signal is determined not to be within the specified range of frequencies, in the converted current signal determining step the converted current signal is determined to indicate an anomaly;

the converted voltage signal determining step further comprises:
- a voltage frequency range determining step of determining whether or not the frequency indicated by the converted voltage signal is within a prescribed range of frequencies when the frequency indicated by the converted voltage signal is determined to be equal to or greater than the second threshold frequency;

when the frequency indicated by the converted voltage signal is determined in the voltage frequency range determining step to be within the prescribed range of frequencies, in the converted voltage signal determining step the converted voltage signal is determined to be generated by the transmission of the voltage signal over the second communication line, and when the frequency indicated by the converted voltage signal is determined not to be within the prescribed range of frequencies, in the converted voltage signal determining step the converted voltage signal is determined to indicate an anomaly;

in the switch-over step, when the converted current signal is determined to indicate the anomaly, the switch-over so as not to transmit the converted current signal, and simultaneously so as to transmit the converted voltage signal is performed, and, when the converted voltage signal is determined to indicate the anomaly, the switch-over so as not to transmit the converted voltage signal, and simultaneously so as to transmit the converted current signal is performed.

15. A non-transitory computer-readable recording medium storing a program for causing a computer that controls an analysis device to function as:

a converted current signal generator that converts a current detected by a current sensor and flowing through a first communication line over which a current signal is transmitted to a voltage and generates a converted current signal indicating a voltage value that corresponds to magnitude of the current flowing through the first communication line;

a converted current signal determiner that determines that the converted current signal is generated by a transmission of the current signal over the first communication line when the converted current signal meets a preset condition;

a converted voltage signal receiver that receives, from a voltage sensor detecting a voltage applied across a second communication line over which a voltage signal is transmitted, the second communication line being different from the first communication line, and generating a converted voltage signal indicating a voltage value that corresponds to magnitude of the detected voltage, the converted voltage signal;

a converted voltage signal determiner that determines that the converted voltage signal is generated by a transmission of the voltage signal over the second communication line when the converted voltage signal meets a preset condition;

a display information generator that generates display information from either one of the converted current signal and the converted voltage signal;

an outputter that outputs the generated display information to a display device on which the display information is displayable; and a switcher that performs, when the converted current signal is determined to be generated by the transmission of the current signal over the first communication line, a switch-over so as to transmit the converted current signal to the display information generator, and simultaneously so as not to transmit the converted voltage signal to the display information generator, and that performs, when the converted voltage signal is determined to be generated by the transmission of the voltage signal over the second communication line, a switch-over so as to transmit the converted voltage signal to the display information generator, and simultaneously so as not to transmit the converted current signal to the display information generator.

16. The non-transitory computer-readable recording medium according to claim 15, wherein:

the converted current signal determiner comprises:
a threshold current determiner that determines whether or not the voltage value indicated by the converted current signal is equal to or greater than a first threshold value; and
a current-flow duration determiner that determines whether or not a time duration over which the threshold current determiner continues to determine that the voltage value indicated by the converted current signal is equal to or greater than the first threshold value has passed a first time duration;

when the time duration, over which the threshold current determiner continues to determine that the voltage value indicated by the converted current signal is equal to or greater than the first threshold value, is determined to have passed the first time duration, the converted current signal determiner determines that the converted current signal is generated by the transmission of the current signal over the first communication line; and the converted voltage signal determiner comprises:
a threshold voltage determiner that determines whether or not the voltage value indicated by the converted voltage signal is equal to or greater than a second threshold value; and
a voltage duration determiner that determines whether or not a time duration over which the threshold voltage determiner continues to determine that the voltage value indicated by the converted voltage signal is equal to or greater than the second threshold value has passed a second time duration; and when the time duration, over which the threshold voltage determiner continues to determine that the voltage value indicated by the converted voltage signal is equal to or greater than the second threshold value, is determined to have passed the second time duration, the converted voltage signal determiner determines that the converted voltage signal is generated by the transmission of the voltage signal over the second communication line.

17. The non-transitory computer-readable recording medium according to claim 16, wherein:

the converted current signal determiner further comprises:
a current range determiner that determines whether or not the voltage value indicated by the converted current signal is within a specified range when the time duration over which the threshold current determiner continues to determine that the voltage value indicated by the converted current signal is equal to or greater than the first threshold value is determined to have passed the first time duration;

when the voltage value indicated by the converted current signal is determined to be within the specified range, the converted current signal determiner determines that the converted current signal is generated by the transmission of the current signal over the first communication line, and when the voltage value indicated by the converted current signal is determined not to be within the specified range, the converted current signal determiner determines that the converted current signal indicates an anomaly;

the converted voltage signal determiner further comprises:

a voltage range determiner that determines whether or not the voltage value indicated by the converted voltage signal is within a prescribed range when the time duration over which the threshold voltage determiner continues to determine that the voltage value indicated by the converted voltage signal is equal to or greater than the second threshold value is determined to have passed the second time duration;

when the voltage value indicated by the converted voltage signal is determined to be within the prescribed range, the converted voltage signal determiner determines that the converted voltage signal is generated by the transmission of the voltage signal over the second communication line, and when the voltage value indicated by the converted voltage signal is determined not to be within the prescribed range, the converted voltage signal determiner determines that the converted voltage signal indicates an anomaly; and the switcher performs, when the converted current signal is determined to indicate the anomaly, the switch-over so as not to transmit the converted current signal to the display information generator, and simultaneously so as to transmit the converted voltage signal to the display information generator, and the switcher performs, when the converted voltage signal is determined to indicate the anomaly, the switch-over so as not to transmit the converted voltage signal to the display information generator, and simultaneously so as to transmit the converted current signal to the display information generator.

18. The non-transitory computer-readable recording medium according to claim 11, wherein:
the converted current signal determiner comprises:
a current frequency determiner that determines whether or not a frequency indicated by the converted current signal is equal to or greater than a first threshold frequency;
when the frequency of the converted current signal is determined by the current frequency determiner to be equal to or greater than the first threshold frequency, the converted current signal determiner determines that the converted current signal is generated by the transmission of the current signal over the first communication line; and
the converted voltage signal determiner comprises:
a voltage frequency determiner that determines whether or not a frequency indicated by the converted voltage signal is equal to or greater than a second threshold frequency; and
when the frequency indicated by the converted voltage signal is determined by the voltage frequency determiner to be equal to or greater than the second threshold frequency, the converted voltage signal determiner determines that the converted voltage signal is generated by the transmission of the voltage signal over the second communication line.

19. The non-transitory computer-readable recording medium according to claim 18, wherein:
the converted current signal determiner further comprises:
a current frequency range determiner that determines whether or not the frequency indicated by the converted current signal is within a specified range of frequencies when the frequency indicated by the converted current signal is determined to be equal to or greater than the first threshold frequency;
when the frequency indicated by the converted current signal is determined by the current frequency range determiner to be within the specified range of frequencies, the converted current signal determiner determines that the converted current signal is generated by the transmission of the current signal over the first communication line, and when the frequency indicated by the converted current signal is determined not to be within the specified range of frequencies, the converted current signal determiner determines that the converted current signal-indicates an anomaly;
the converted voltage signal determiner further comprises:
a voltage frequency range determiner that determines whether or not the frequency indicated by the converted voltage signal is within a prescribed range of frequencies when the frequency indicated by the converted voltage signal is determined to be equal to or greater than the second threshold frequency;
when the frequency indicated by the converted voltage signal is determined by the voltage frequency range determiner to be within the prescribed range of frequencies, the converted voltage signal determiner determines that the converted voltage signal is generated by the transmission of the voltage signal over the second communication line, and when the frequency indicated by the converted voltage signal is determined not to be within the prescribed range of frequencies, the converted voltage signal determiner determines that the converted voltage signal indicates an anomaly;
the switcher performs, when the converted current signal is determined to indicate the anomaly, the switch-over so as not to transmit the converted current signal to the display information generator, and simultaneously so as to transmit the converted voltage signal to the display information generator, and the switcher performs, when the converted voltage signal is determined to indicate the anomaly, the switch-over so as not to transmit the converted voltage signal to the display information generator, and simultaneously so as to transmit the converted current signal to the display information generator.

* * * * *